US012652806B2

(12) United States Patent
Hou et al.

(10) Patent No.: US 12,652,806 B2
(45) Date of Patent: Jun. 9, 2026

(54) FERROELECTRIC MEMORY AND STORAGE DEVICE

(71) Applicant: HUAWEI TECHNOLOGIES CO., LTD., Shenzhen (CN)

(72) Inventors: Zhaozhao Hou, Shenzhen (CN); Sitong Bu, Shanghai (CN); Yichen Fang, Beijing (CN); Yu Zhang, Shanghai (CN); Jeffrey Junhao Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 192 days.

(21) Appl. No.: 18/359,823

(22) Filed: Jul. 26, 2023

(65) Prior Publication Data

US 2024/0130139 A1     Apr. 18, 2024

Related U.S. Application Data

(63) Continuation of application No. PCT/CN2021/074505, filed on Jan. 29, 2021.

(51) Int. Cl.
*G11C 11/22* (2006.01)
*H10B 53/30* (2023.01)

(52) U.S. Cl.
CPC ............ *H10B 53/30* (2023.02); *G11C 11/221* (2013.01); *G11C 11/2273* (2013.01); *G11C 11/2275* (2013.01)

(58) Field of Classification Search
CPC ........ H10B 53/30; H10B 53/20; H10B 53/50; G11C 11/221; G11C 11/2273; G11C 11/2275; G11C 11/2293; G11C 11/2255; G11C 11/2257; G11C 11/2259; H10D 1/682

See application file for complete search history.

(56) References Cited

U.S. PATENT DOCUMENTS

| | | | |
|---|---|---|---|
| 2003/0235067 A1 | 12/2003 | Sakai et al. | |
| 2022/0139437 A1* | 5/2022 | Ocker .................... | G11C 11/221 |
| | | | 365/145 |
| 2022/0139931 A1* | 5/2022 | Ocker ................. | G11C 11/2275 |
| | | | 257/295 |
| 2024/0306396 A1* | 9/2024 | Zhu ........................ | H10B 51/30 |

FOREIGN PATENT DOCUMENTS

| | | |
|---|---|---|
| CN | 112018185 A | 12/2020 |
| JP | 3131340 B2 | 1/2001 |

* cited by examiner

*Primary Examiner* — Jerome Leboeuf

(57) ABSTRACT

A ferroelectric memory includes at least one storage cell. Each storage cell includes a transistor, a first ferroelectric capacitor, and at least one voltage divider capacitor. The transistor includes a gate electrode, a source electrode, and a drain electrode. One electrode of the first ferroelectric capacitor is connected to the gate electrode. The other electrode of the first ferroelectric capacitor is connected to a word line. One electrode of each voltage divider capacitor in the at least one voltage divider capacitor is connected to the gate electrode, and the other electrode of each voltage divider capacitor in the at least one voltage divider capacitor is connected to the source electrode.

18 Claims, 14 Drawing Sheets

FERROELECTRIC MEMORY AND STORAGE DEVICE

CROSS-REFERENCE TO RELATED APPLICATIONS

This disclosure is a continuation of International Application No. PCT/CN2021/074505, filed on Jan. 29, 2021, the disclosure of which is hereby incorporated by reference in its entirety.

TECHNICAL FIELD

This disclosure relates to the field of data storage technologies, and in particular, to a ferroelectric memory and a storage device.

BACKGROUND

A ferroelectric random access memory (FRAM) may also be referred to as a ferroelectric memory. The ferroelectric memory is a memory made according to a principle that a polarization direction of a ferroelectric material changes under the influence of an electric field.

As shown in FIG. 1a, one storage cell in the ferroelectric memory includes one transistor Q1 and one ferroelectric capacitor C1. The transistor Q1 includes a gate electrode G1, a source electrode S1, and a drain electrode D1. The ferroelectric capacitor C1 is formed on the gate electrode G1. After the storage cell in FIG. 1a is vertically cut down along a straight line HH', as shown in FIG. 1b, the ferroelectric memory may include a substrate 101, a drain electrode D region 102, a source electrode S region 103, a channel CH region 104, a gate electrode layer 105, a ferroelectric layer 106, and an interface insulation layer 107. The interface insulation layer 107 may be located between the substrate 101 and the ferroelectric layer 106, and is configured to suppress an interface reaction between the substrate 101 and the ferroelectric layer 106 in a manufacturing process. Due to the interface reaction, a defect site capable of capturing a charge may be generated at a direct interface between the substrate 101 and the ferroelectric layer 106.

When a write voltage or a read voltage is applied between the gate electrode layer 105 and the substrate 101, a voltage drop across the interface insulation layer 107 is generated. Therefore, the write voltage or the read voltage needs to be increased to compensate for the voltage drop. When the write voltage or the read voltage applied between the substrate 101 and the ferroelectric layer 106 is increased to compensate for the voltage drop of the interface insulation layer 107, the interface insulation layer 107 may be electrically damaged due to the increased write voltage or read voltage. As a result, a charge trap may be formed in the interface insulation layer 107 or at an interface between the interface insulation layer 107 and the channel CH region 104. This trap may be a leakage path that enables a charge to travel between the substrate 101 and the channel CH region 104. Consequently, the durability and reliability of a ferroelectric storage component are deteriorated.

SUMMARY

The present disclosure provides a ferroelectric memory and a storage device, to reduce an operating voltage and improve durability of the ferroelectric memory.

According to a first aspect, a ferroelectric memory is provided. The ferroelectric memory includes at least one storage cell, and each storage cell includes a transistor, a first ferroelectric capacitor, and at least one voltage divider capacitor. The transistor includes a gate electrode, a source electrode, and a drain electrode. One electrode of the first ferroelectric capacitor is connected to the gate electrode, and the other electrode of the first ferroelectric capacitor is connected to a word line. One electrode of each voltage divider capacitor in the at least one voltage divider capacitor is separately connected to the gate electrode, and the other electrode of each voltage divider capacitor in the at least one voltage divider capacitor is separately connected to the source electrode.

The transistor may be a gate-all-around transistor. For example, the transistor is a vertical nanowire transistor. The transistor includes a gate electrode, a channel, and a source electrode and a drain electrode that are located at two ends of the channel. The gate electrode may be a floating gate (FG). The floating gate may be in a floating state. To be specific, the gate electrode is in a suspended state without a conductor out-lead, and is electrically suspended, that is, not connected to an external circuit. The channel may be columnar. In the foregoing technical solution, in each storage cell in the ferroelectric memory, one electrode of the first ferroelectric capacitor is connected to the gate electrode, and the other electrode of the first ferroelectric capacitor is connected to the word line. The at least one voltage divider capacitor is included in each storage cell in the ferroelectric memory, and one electrode of each voltage divider capacitor in the at least one voltage divider capacitor is separately connected to the gate electrode. In this case, one electrode of the first ferroelectric capacitor is connected to one electrode of each voltage divider capacitor in the at least one voltage divider capacitor through the gate electrode, and the first ferroelectric capacitor is connected to the at least one voltage divider capacitor in series. The other electrode of each voltage divider capacitor in the at least one voltage divider capacitor is connected to the source electrode, and the at least one voltage divider capacitor is connected in parallel to the source electrode and the gate electrode of the transistor. In this case, the at least one voltage divider capacitor is connected in parallel with a transistor capacitor of the transistor, and a total capacitance of the parallel transistor capacitor and the at least one voltage divider capacitor increases. Correspondingly, an operating voltage allocated to the transistor capacitor of the transistor decreases. In other words, a voltage allocated to the source electrode and the gate electrode of the transistor decreases, and an operating voltage allocated to the first ferroelectric capacitor increases. In this way, the operating voltage allocated to the first ferroelectric capacitor that is connected in series to the at least one voltage divider capacitor is increased by disposing the at least one voltage divider capacitor.

When the operating voltage allocated to the first ferroelectric capacitor increases, the first ferroelectric capacitor may reach a polarization state with a smaller operating voltage. For example, in a conventional technology, a 3 V operating voltage is required to electrically polarize the first ferroelectric capacitor. Currently, the operating voltage allocated to the first ferroelectric capacitor increases, so that a smaller operating voltage, for example, 2 V, can electrically polarize the first ferroelectric capacitor and the operating voltage is reduced. In this way, a phenomenon that the operating voltage (for example, a write voltage or a read voltage) increases to overcome a voltage drop across an interface insulation layer is avoided, and formation of a trap facilitating current leakage in the interface insulation layer or at an interface that is between the interface insulation layer and the channel is avoided, that is, an interface defect in the interface insulation layer or at the interface that is between the interface insulation layer and the channel is reduced, so that a charge leakage path formed due to breakdown caused by accumulation of defects (interface defects) is avoided, the charge leakage on the leakage path is reduced, and durability and reliability of the ferroelectric memory are improved.

Further, the formation of the trap facilitating current leakage in the interface insulation layer or at the interface that is between the interface insulation layer and the channel is avoided, to avoid that a charge captured by the trap escapes from the trap, and avoid a loss of a stored charge caused by the formed charge leakage path. This improves a charge retention force, and improves a charge storage capability of the ferroelectric memory. The charge storage capability determines a storage window of the ferroelectric memory. In this way, performance of the ferroelectric memory, for example, the storage window, is improved.

In a possible implementation of the first aspect, the voltage divider capacitor is a high-dielectric-constant capacitor or a ferroelectric capacitor. The high-dielectric-constant capacitor may use a high-dielectric-constant material as a dielectric material of the capacitor, and the ferroelectric capacitor may use a ferroelectric material as a dielectric material of the capacitor. When a medium is in an applied electric field, an induced charge is generated and the electric field is weakened. A ratio of the original applied electric field (in vacuum) to a final electric field in the medium is a dielectric constant (permittivity). In a possible implementation, the high-dielectric-constant (high-k) material is a type of polymer material with a high dielectric constant, and may be a material whose dielectric constant is greater than that of silicon dioxide. The dielectric constant of silicon dioxide is 3.9. The high-dielectric-constant material includes, for example, tantalum pentaoxide, titanium oxide, and barium strontium titanate. The ferroelectric material is a material that has spontaneous electric polarization without applying an external electric field. Specifically, the ferroelectric material may maintain any one of two stable remanent polarization states. These features can be used in a storage device to store logical information "0" or "1" in a non-volatile manner. Ferroelectric materials include barium titanate ($BaTiO_3$), potassium dihydrogen phosphate ($KH_2PO_4$), and the like.

In the foregoing technical solution, in each storage cell in the ferroelectric memory, the voltage divider capacitor may be a high-dielectric-constant capacitor. The high-dielectric-constant capacitor is connected in parallel to the transistor, so that a voltage allocated to the transistor is reduced, and the voltage allocated to the first ferroelectric capacitor is increased. A structure of the ferroelectric memory can reduce the operating voltage, reduce the interface defect in the ferroelectric memory, improve the durability and reliability of the ferroelectric memory, and enlarge the storage window.

The voltage divider capacitor may be a ferroelectric capacitor. The ferroelectric capacitor is connected in parallel to the transistor, so that the voltage allocated to the transistor is reduced, and the voltage allocated to the first ferroelectric capacitor is increased. Therefore, a larger storage window can be implemented under a same operating voltage. The structure of the ferroelectric memory can reduce the operating voltage, reduce the interface defect in the ferroelectric memory, and improve the durability and reliability of the ferroelectric memory. Further, the ferroelectric capacitor serves as a second ferroelectric capacitor. The second ferroelectric capacitor and the first ferroelectric capacitor form opposite polarization, to maintain charge balance of the gate electrode in the transistor, and reduce charge leakage between a substrate and the channel.

In another possible implementation of the first aspect, the at least one voltage divider capacitor includes at least one first capacitor and at least one second capacitor. The first capacitor is a high-dielectric-constant capacitor, and the second capacitor is a ferroelectric capacitor. The at least one voltage divider capacitor may be a high-dielectric-constant capacitor. The at least one voltage divider capacitor may alternatively be a ferroelectric capacitor, and the at least one voltage divider capacitor includes a high-dielectric-constant capacitor and a ferroelectric capacitor. In the foregoing implementation, the transistor capacitor is connected in parallel to a plurality of voltage divider capacitors to increase the total capacitance, to reduce a voltage allocated to a total capacitor and increase the voltage allocated to the first ferroelectric capacitor. The structure of the ferroelectric memory can reduce the operating voltage, reduce the interface defect in the ferroelectric memory, improve the durability and reliability of the ferroelectric memory, and enlarge the storage window.

In another possible implementation of the first aspect, the ferroelectric memory further includes a bit line, a source line, and a word line. The source line is connected to the source electrode, the bit line is connected to the drain electrode, and the word line is connected to the other electrode of the first ferroelectric capacitor. In the possible implementation, different voltages are separately applied to the bit line, the source line, and the word line, so that reading and writing on the storage cell can be implemented.

In another possible implementation of the first aspect, the ferroelectric memory further includes a first voltage line, a second voltage line, and a third voltage line. One end of the first voltage line is connected to the source electrode, one end of the second voltage line is connected to the drain electrode, one end of the third voltage line is connected to the other electrode of the first ferroelectric capacitor, and the other ends of the first voltage line, the second voltage line, and the third voltage line are separately connected to a controller, to receive a read and write control voltage. In the foregoing possible implementation, different voltages are separately applied to the first voltage line, the second voltage line, and the third voltage line, so that reading and writing on the storage cell can be implemented.

In another possible implementation of the first aspect, the at least one storage cell includes a first storage cell. When data is written into the first storage cell, a voltage difference between the first voltage line and the second voltage line of the first storage cell is 0, and an absolute value of a voltage difference between the third voltage line and the second voltage line of the first storage cell is equal to a first specified voltage. In the foregoing possible implementation, data can be written into the first storage cell, and when the voltage difference between the source electrode and the drain electrode is equal to 0, a leakage current of a write operation can be suppressed.

In another possible implementation of the first aspect, the at least one storage cell further includes a second storage cell. When the data is written into the first storage cell, an absolute value of a voltage difference between the third voltage line and the second voltage line of the second storage cell is less than one half of the first specified voltage.

In the foregoing possible implementation, it can be ensured that a status of the second storage cell is not affected in a data writing process.

In another possible implementation of the first aspect, when the data is written into the first storage cell, the first voltage line, the second voltage line, and the third voltage line of a second storage cell in the at least one storage cell are all in the floating state. In the foregoing possible implementation, it can be ensured that the status of the second storage cell is not affected in the data writing process.

In another possible implementation of the first aspect, when the data is written into the first storage cell, bias voltages of the first voltage line, the second voltage line, and the third voltage line of the second storage cell in the at least one storage cell are all one half of the first specified voltage. In the foregoing possible implementation, it can be ensured that the status of the second storage cell is not affected in the data writing process.

In another possible implementation of the first aspect, when the data is read from the first storage cell in the at least one storage cell, a bias voltage of the first voltage line of the first storage cell is 0, a bias voltage of the second voltage line of the first storage cell is a second specified voltage, and a bias voltage of the third voltage line of the first storage cell is a third specified voltage. In the foregoing possible implementation, data reading in the first storage cell can be implemented, and it can be ensured that the data in the first storage cell is consistent before and after a reading operation after the data reading is completed.

In another possible implementation of the first aspect, when the data is read from the first storage cell in the at least one storage cell, the third voltage line of the second storage cell in the at least one storage cell is in the floating state or grounded. In the foregoing possible implementation, it can be ensured that a status of an unselected second storage cell is not affected in the data reading process.

In another possible implementation of the first aspect, when the data is read from the first storage cell in the at least one storage cell, the bias voltages of the first voltage line and the second voltage line of the second storage cell in the at least one storage cell are both 0. In the foregoing possible implementation, it can be ensured that the status of the unselected second storage cell is not affected in the data reading process.

According to a second aspect, a storage device is provided. The storage device includes a circuit board and a ferroelectric memory connected to the circuit board, and the ferroelectric memory is the ferroelectric memory provided in any one of the first aspect or the possible implementations of the first aspect.

According to a third aspect, a storage device is provided. The storage device includes a controller and a ferroelectric memory. The controller is configured to control reading and writing of the ferroelectric memory, and the ferroelectric memory is the ferroelectric memory provided in any one of the first aspect or the possible implementations of the first aspect.

It may be understood that any storage device provided above, a non-transitory computer-readable storage medium used with a computer, and the like include a same or corresponding feature of the ferroelectric memory provided above. Therefore, for beneficial effects that can be achieved, refer to beneficial effects of the corresponding integrated circuit provided above. Details are not described herein again.

BRIEF DESCRIPTION OF DRAWINGS

FIG. 1b is a cross-sectional view of the storage cell shown in FIG. 1a;

FIG. 4b is a cross-sectional view of the storage cell shown in FIG. 4a;

DESCRIPTION OF EMBODIMENTS

Figure 1A:
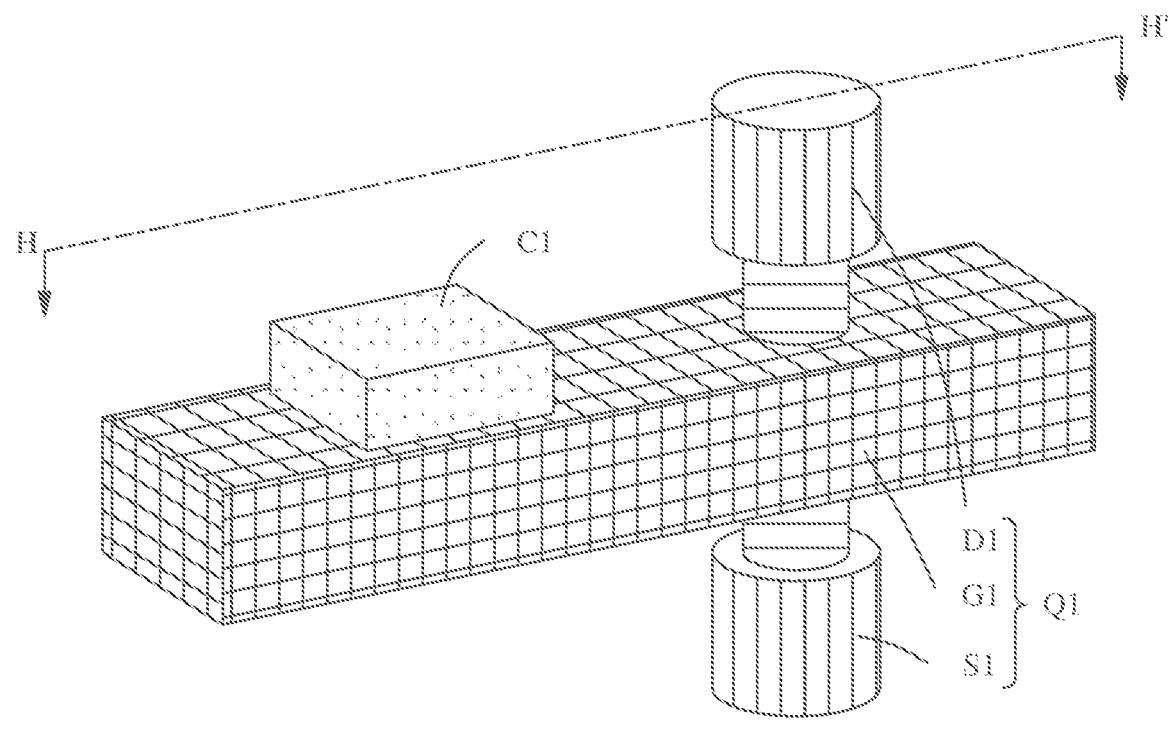
FIG. 1a is a three-dimensional diagram of a storage cell according to a current technology.
Figure 1B:
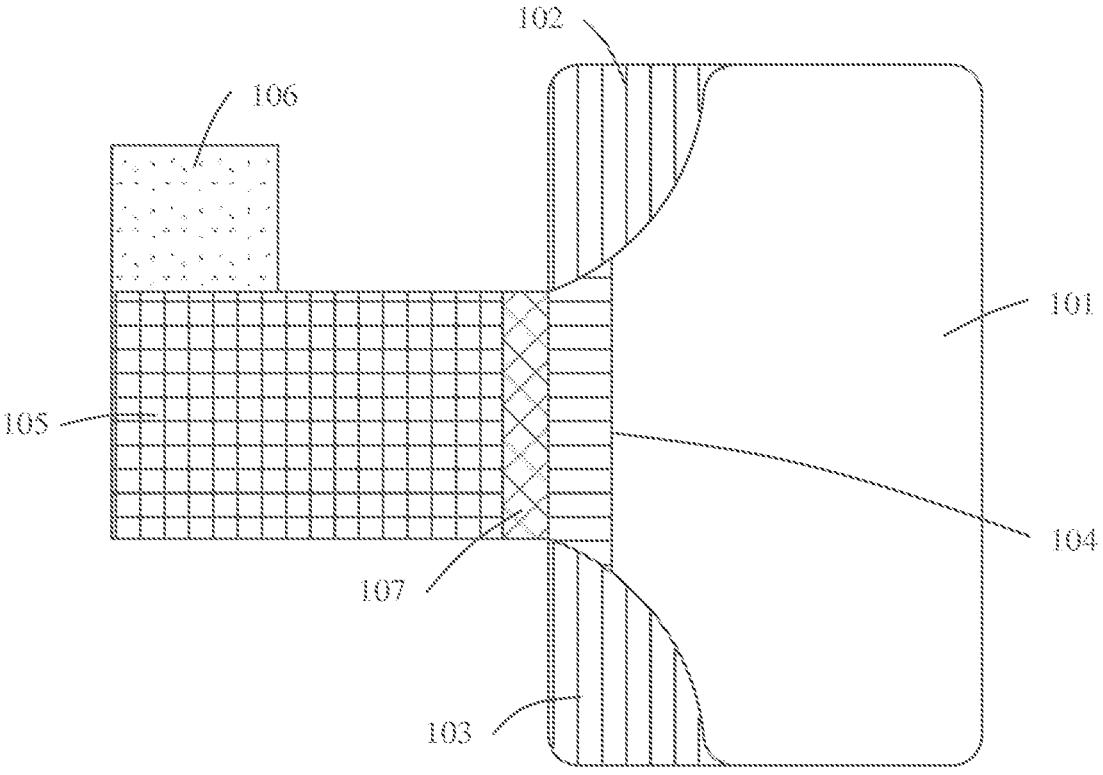

Construction and practice of various embodiments are discussed in detail below. However, it should be understood that a plurality of applicable inventive concepts provided in this application can be implemented in a plurality of specific environments. The specific embodiments discussed are merely illustrative of specific manners to implement and use the specification and the technologies, and do not limit the scope of this disclosure.

Unless defined otherwise, all technical and scientific terms used herein have the same meaning as commonly understood by a person of ordinary skill in the art to which this disclosure belongs.

Each circuit or another component may be described as or referred to as "configured to" perform one or more tasks. In this case, "configured to" is used to imply a structure by indicating that the circuit/component includes a structure (for example, a circuit system) that performs one or more tasks during operation. Therefore, the circuit/component can be referred to as being configured to perform the task even when the specified circuit/component is not currently operational (for example, is not on). The circuit/component used with the term "configured to" includes hardware, for example, a circuit that performs an operation.

The following describes the technical solutions in embodiments of this disclosure with reference to the accompanying drawings in embodiments of this disclosure. In this disclosure, "at least one" means one or more, and "a plurality of" means two or more. "And/or" describes an association relationship between associated objects, and represents that three relationships may exist. For example, A and/or B may represent the following cases: Only A exists, both A and B exist, and only B exists, where A and B may be singular or plural. The character "/" usually indicates an "or" relationship between the associated objects. "At least one of the following items (pieces)" or a similar expression thereof refers to any combination of these items, including any combination of singular items (pieces) or plural items (pieces). For example, at least one of a, b, or c may represent: a, b, c, a and b, a and c, b and c, or a, b, and c, where a, b, and c may be singular or plural. In addition, in embodiments of this disclosure, the terms such as "first" and "second" are not intended to limit a quantity or an execution sequence.

It should be noted that, in this disclosure, the word such as "example" or "for example" is used to represent giving an example, an illustration, or a description. Any embodiment or design scheme described as an "example" or "for example" in this disclosure should not be explained as being more preferred or having more advantages than another embodiment or design scheme. Exactly, use of the word "example", "for example", or the like is intended to present a related concept in a specific manner.

It should be noted that, in this disclosure, "connection" includes one or more of "mechanical connection", "electrical connection", and "communication connection". Moreover, in the context, it also should be understood that, when it is mentioned that one element is connected "above" or "below" another element, the element can be directly connected "above" or "below" the another element, or may be indirectly connected "above" or "below" the another element through an intermediate element.

Figure 2:
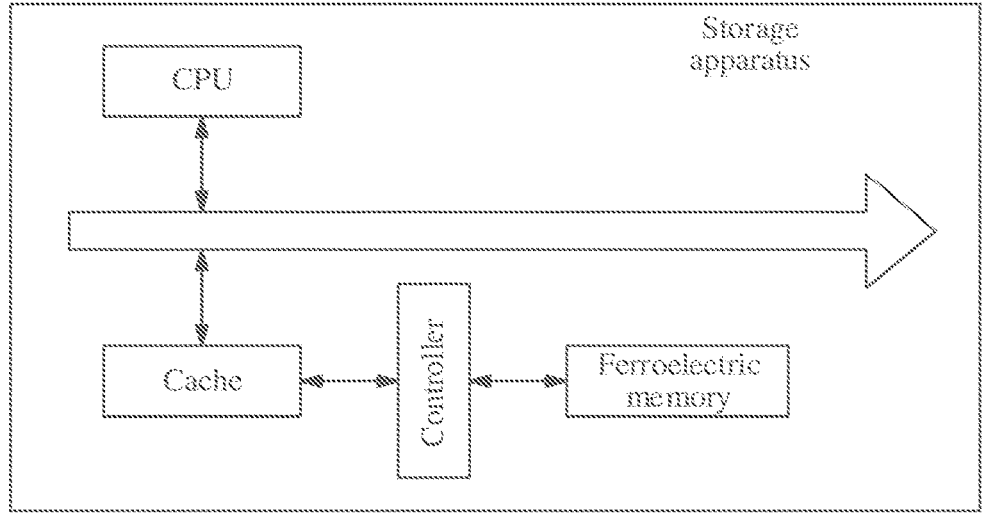
FIG. 2 is a diagram of a structure of a storage system according to an embodiment of this application.

The technical solutions of this disclosure may be applied to various storage systems using ferroelectric memories. For example, the technical solutions of this disclosure may be applied to a computer, or may be applied to a storage system including a memory or a storage system including a processor and a memory. The processor may be a central processing unit (CPU), an artificial intelligence (AI) processor, a digital signal processor, a neural network processor, or the like. For example, FIG. 2 is a diagram of a structure of a storage system according to an embodiment of this disclosure. The storage system may include the ferroelectric memory. Optionally, the storage system may further include a CPU, a cache, a controller, and the like. The CPU, the cache, the controller, and the ferroelectric memory may be integrated together. The ferroelectric memory may be coupled to the cache by using the controller, and may be coupled to the CPU by using the cache.

Figure 3:
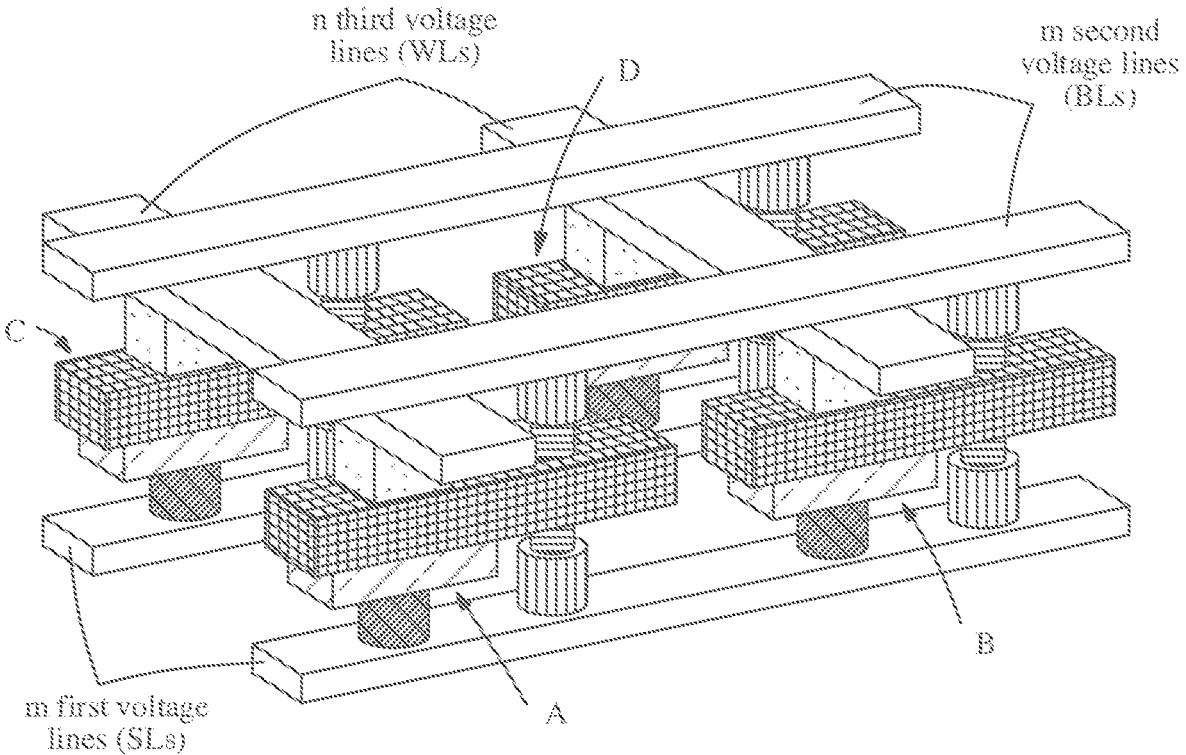
FIG. 3 is a diagram of a structure of a ferroelectric memory according to an embodiment of this application.

FIG. 3 is a diagram of a structure of a ferroelectric memory according to an embodiment of this disclosure. The ferroelectric memory may include at least one storage cell, a first voltage line, a second voltage line, and a third voltage line. One storage cell may be a cell configured to store 1-bit data. For example, the ferroelectric memory includes a storage cell array with m rows and n columns, m first voltage lines, m second voltage lines, and n third voltage lines. The storage cell array includes at least one storage cell, and m and n are positive integers. In FIG. 3, an example in which values of m and n are both equal to 2 is used for description. An example in which the at least one storage cell includes four storage cells is used for description. When the at least one storage cell includes a plurality of storage cells, the plurality of storage cells may be located at a same layer, or may be disposed on different layers by stacking. In a possible implementation, when a first storage cell A, a second storage cell B, a third storage cell C, and a fourth storage cell D are located at a same layer, as shown in FIG. 3, the first storage cell A and the second storage cell B are located in a same row, the third storage cell C and the fourth storage cell D are located in a same row, the first storage cell A and the third storage cell C are located in a same column, and the second storage cell B and the fourth storage cell D are located in a same column. First voltage lines of storage cells in a same row may be connected to each other, second voltage lines of storage cells in a same row may be connected to each other, and third voltage lines of storage cells in a same column may be connected to each other. For example, a first voltage line of the first storage cell A may be connected to a first voltage line of the second storage cell B, and a second voltage line of the first storage cell A may be connected to a second voltage line of the second storage cell B. Correspondingly, a first voltage line and a second voltage line of the third storage cell C may be connected to a first voltage line and a second voltage line of the fourth storage cell D respectively. A third voltage line of the first storage cell A may be connected to a third voltage line of the third storage cell C, and a third voltage line of the second storage cell B may be connected to a third voltage line of the fourth storage cell D.

In a possible implementation, the plurality of storage cells in the at least one storage cell may be located at different layers. The first storage cell A and the second storage cell B are located at a first layer, and the third storage cell C and the fourth storage cell D are located at a second layer. The first voltage lines of the storage cells at the first layer and the second layer may be multiplexed, to be specific, the storage cells at the first layer and the second layer share a same first voltage line. The second voltage lines of the storage cells at the first layer and the second layer may be multiplexed, to be specific, the storage cells at the first layer and the second layer share a same second voltage line. The third voltage lines of the storage cells at the first layer and the second layer may be multiplexed, to be specific, the storage cells at the first layer and the second layer share a same third voltage line.

In a possible implementation, when the storage cells are disposed on different layers by stacking, the ferroelectric memory further includes an isolation layer disposed between the first-layer storage cell and the second-layer storage cell, so that each storage cell has a first voltage line, a second voltage line, and a third voltage line that are independent. The foregoing manner of sharing the first voltage line, the second voltage line, or the third voltage line, can reduce a quantity of connection lines of the first voltage line, the second voltage line, or the third voltage line, and ensure that layout area overheads are small. In addition, sharing the first voltage line, the second voltage line, or the third voltage line can reduce manufacturing costs. In this disclosure, a manufacturing process of the storage cell is simple, and may be integrated into a back-end-of-line process, to implement high area efficiency of the storage cell and a control circuit in a three-dimensional stacking manner. In addition, the foregoing manner of disposing the isolation layer can also ensure that the layout area overheads are small.

In a possible implementation, the first voltage line is connected to a source electrode of each storage cell, the second voltage line is connected to a drain electrode of each storage cell, and the third voltage line is connected to a gate electrode of each storage cell, that is, connected to the other electrode of a first ferroelectric capacitor of each storage cell.

Optionally, the first voltage line may be a source line (SL), the second voltage line may be a bit line (BL), and the third voltage line may be a word line (WL). In this case, the source line is connected to the source electrode of each storage cell, the bit line is connected to the drain electrode of each storage cell, and the word line is connected to the other electrode of the first ferroelectric capacitor of each storage cell.

Optionally, for a storage cell in the at least one storage cell, a first voltage line connected to the storage cell is parallel to a second voltage line connected to the storage cell, the first voltage line connected to the storage cell is perpendicular to a third voltage line connected to the storage cell, and the second voltage line connected to the storage cell is perpendicular to the third voltage line connected to the storage cell.

The following uses one storage cell in the storage cell array of the ferroelectric memory as an example to describe a structure of the storage cell in detail.

Figure 4A:
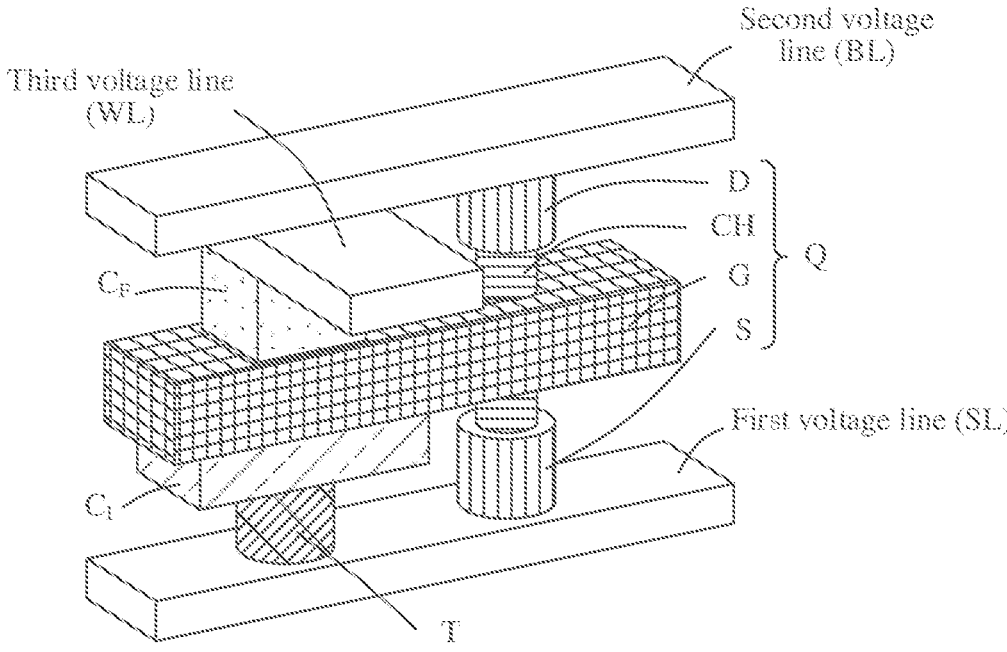
FIG. 4a is a three-dimensional diagram of a storage cell according to an embodiment of this application.

FIG. 4a is a three-dimensional diagram of a storage cell according to an embodiment of this disclosure. The storage cell includes a transistor Q, a first ferroelectric capacitor $C_F$, and at least one voltage divider capacitor $C_I$. The transistor Q includes a gate electrode G, a channel CH, and a source electrode S and a drain electrode D that are located at two ends of the channel CH. One electrode (namely, a first electrode) of the first ferroelectric capacitor $C_F$ is connected to the gate electrode G, and the other electrode (namely, a second electrode) of the first ferroelectric capacitor $C_F$ is connected to a word line WL. One electrode (namely, a first electrode) of each voltage divider capacitor $C_I$ in the at least one voltage divider capacitor $C_I$ is connected to the gate electrode G, and the other electrode (namely, a second electrode) of each voltage divider capacitor $C_I$ in the at least one voltage divider capacitor $C_I$ is connected to the source electrode S. In a possible implementation, the second electrode of each voltage divider capacitor $C_I$ in the at least one voltage divider capacitor $C_I$ may be connected to the source electrode S through a metal trace (for example, a first voltage line) and a via T.

In this embodiment of this disclosure, the transistor Q in the storage cell may be a gate-all-around (GAA) transistor, the gate electrode G may be in a floating state. To be specific, the gate electrode G is in a suspended state without a conductor out-lead. The channel CH may be columnar. In actual application, the transistor Q may alternatively be a transistor of another structure or type. This is not specifically limited in this embodiment of this disclosure. In this embodiment of this disclosure, only an example in which the transistor Q is a GAA transistor is used for description.

The gate electrode G of the transistor Q is connected to a third voltage line (word line WL) through the first ferroelectric capacitor $C_F$, the drain electrode D of the transistor Q is connected to a second voltage line (bit line BL), and the source electrode S of the transistor Q is connected to a first voltage line (source line SL).

Figure 4B:
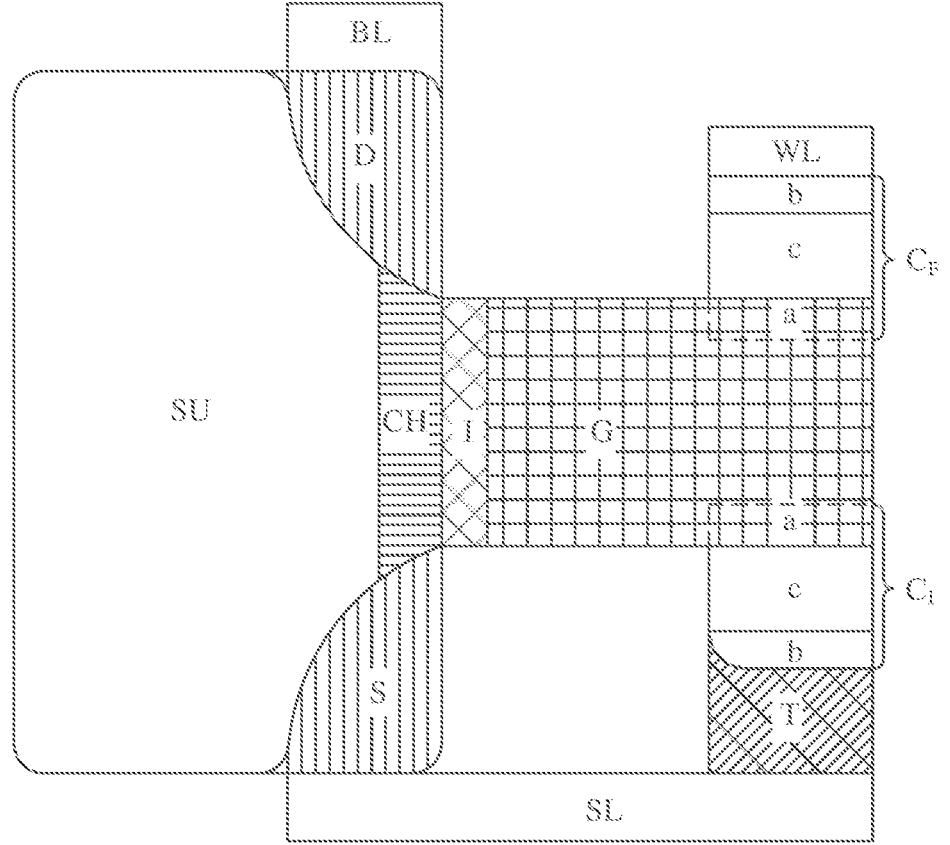
Figure 4C:
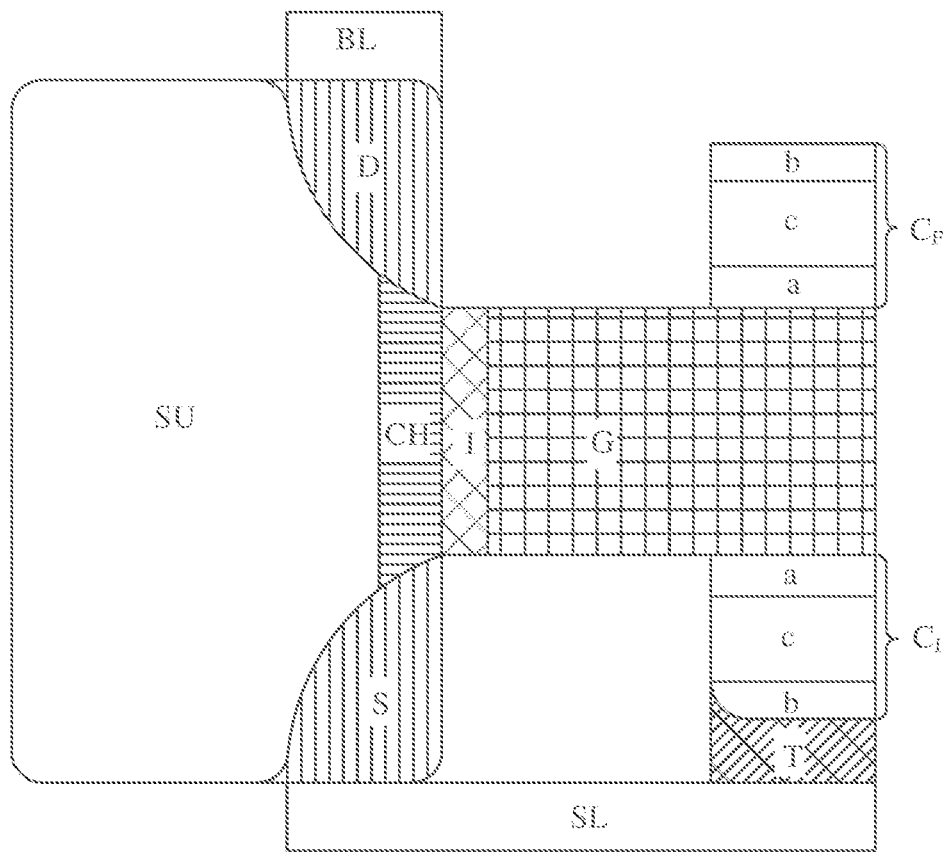
FIG. 4c is a cross-sectional view of another storage cell according to an embodiment of this application.

In this embodiment of this disclosure, the first ferroelectric capacitor $C_F$ includes two electrodes and a dielectric material c located between the two electrodes, where the two electrodes include a first electrode a and a second electrode b. Refer to FIG. 4b. After the storage cell is split, the storage cell includes a substrate SU, the channel CH, the source electrode S, the drain electrode D, the gate electrode G, the first ferroelectric capacitor $C_F$, the voltage divider capacitor $C_I$, and an insulation layer I between the gate electrode G and the channel CH. That the first electrode a of the first ferroelectric capacitor $C_F$ is connected to the gate electrode G of the transistor Q may be that the first electrode a of the first ferroelectric capacitor $C_F$ is formed on the gate electrode G, and the gate electrode G is directly used as the first electrode a of the first ferroelectric capacitor $C_F$. Alternatively, refer to FIG. 4c, and that the first electrode a of the first ferroelectric capacitor $C_F$ is connected to the gate electrode G of the transistor Q may be that one first metal plate is formed on the gate electrode G, the first metal plate is used as the first electrode a of the first ferroelectric capacitor $C_F$, and the first metal plate is connected to the gate electrode G. The second electrode b of the first ferroelectric capacitor $C_F$ may be one second metal plate formed on the dielectric material c, and the first ferroelectric capacitor $C_F$ is connected to the word line WL through the second metal plate.

In this embodiment of this disclosure, the dielectric material c is a material characterized by electric polarization, and is an electrical insulating material. The dielectric material c does not have a long-distance drift of carriers under action of an electric field, but still has an electric phenomenon. This electric phenomenon is generated because charged particles also exist in the material. Although these charged particles are bound to a fixed position, charge gravity centers of positive and negative bounding no longer coincide under the action of the electric field, and electric polarization is caused. The electric polarization is a phenomenon that under the action of the electric field, a bound charge in the dielectric material c shifts or a polarity rotates in a direction of the electric field, in other words, a phenomenon that centers of a positive charge and a negative charge in a molecule relatively shift under the action of the electric field to generate an electric dipole moment.

In a possible implementation, the dielectric material c includes a ferroelectric material. The ferroelectric material means that a lattice structure of the material has a spontaneous polarization phenomenon without an external electric field, and a direction of the spontaneous polarization of the material can be reversed or redirected by the external electric field. This feature of the ferroelectric material is also referred to as "ferroelectric phenomena" or "ferroelectric effect". When there is no external electric field action, polarization generated due to ordered arrangement of electric dipoles exists in the lattice. This is referred to as spontaneous polarization. Specifically, the ferroelectric material may maintain any one of two stable remanent polarization (remanent polarization) states. These features can be used in a storage device to store logical information "0" or "1" in a non-volatile manner. Ferroelectric materials may include barium titanate ($BaTiO_3$), potassium dihydrogen phosphate ($KH_2PO_4$), and the like.

In this embodiment of this disclosure, each voltage divider capacitor $C_I$ in the at least one voltage divider capacitor $C_I$ includes two electrodes and a dielectric material c located between the two electrodes, where the two electrodes include a first electrode a and a second electrode b. An example in which the at least one voltage divider capacitor $C_I$ includes one voltage divider capacitor $C_I$ is used for description. As shown in FIG. 4*b*, that the first electrode a of the voltage divider capacitor $C_I$ is connected to the gate electrode G of the transistor Q may be that the first electrode a of the voltage divider capacitor $C_I$ is formed on the gate electrode G, and the gate electrode G is directly used as the first electrode a of the voltage divider capacitor $C_I$. Alternatively, refer to FIG. 4*c*, and that the first electrode a of the voltage divider capacitor $C_I$ is connected to the gate electrode G of the transistor Q may be that one first metal plate is formed on the gate electrode G, the first metal plate is used as the first electrode a of the voltage divider capacitor $C_I$, and the first metal plate is connected to the gate electrode G. The second electrode b of the voltage divider capacitor $C_I$ may be one second metal plate formed on the dielectric material c, and the voltage divider capacitor $C_I$ is connected to the word line WL through the second metal plate.

In this embodiment of this disclosure, the first electrode a of the first ferroelectric capacitor $C_F$ and the first electrode a of each voltage divider capacitor $C_I$ in the at least one voltage divider capacitor $C_I$ are separately connected to the gate electrode G. Specifically, the first ferroelectric capacitor $C_F$ and the voltage divider capacitor $C_I$ are separately formed on two surfaces that are disposed opposite to each other and that are of the gate electrode G. For example, the first ferroelectric capacitor $C_F$ is formed on a surface that is of the gate electrode G and that is away from the source electrode S, and the voltage divider capacitor $C_I$ is formed on a surface that is of the gate electrode G and that is close to the source electrode S. Alternatively, the first electrode a of the first ferroelectric capacitor $C_F$ and the first electrode a of each voltage divider capacitor $C_I$ in the at least one voltage divider capacitor $C_I$ are separately connected to two ends of the gate electrode G.

Figure 4D:
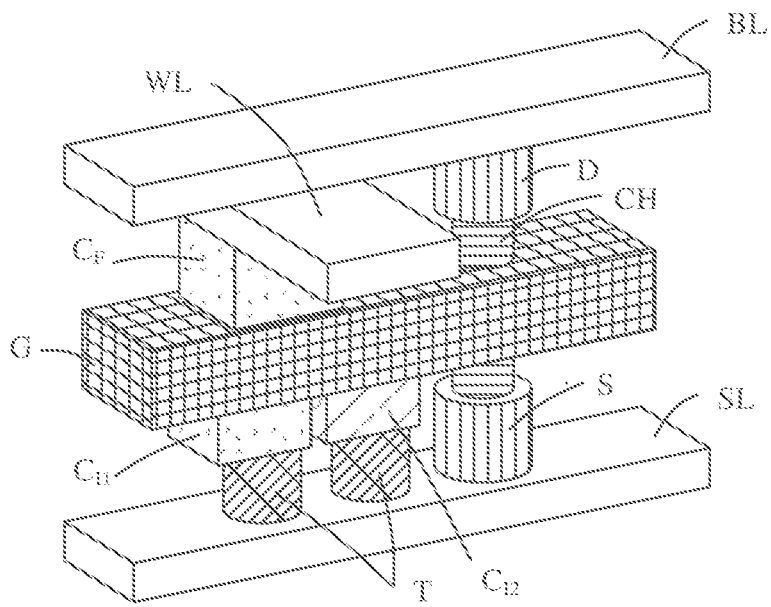
FIG. 4d is a three-dimensional diagram of another storage cell according to an embodiment of this application.

In this embodiment of this disclosure, the at least one voltage divider capacitor $C_I$ may include a plurality of voltage divider capacitors $C_I$. Refer to FIG. 4*d*. An example in which the at least one voltage divider capacitor $C_I$ includes two voltage divider capacitors $C_I$ is used for description. The at least one voltage divider capacitor $C_I$ includes a first capacitor $C_{I1}$ and a second capacitor $C_{I2}$. A first electrode a of the first capacitor $C_{I1}$ is connected to the gate electrode G, and a second electrode b of the first capacitor $C_{I1}$ is connected to the source electrode S of the transistor Q. That is, the second electrode b of the first capacitor $C_{I1}$ is connected to the source line SL. A first electrode a of the second capacitor $C_{I2}$ is connected to the gate electrode G, and a second electrode b of the second capacitor $C_{I2}$ is connected to the source electrode S of the transistor Q. That is, the second electrode b of the second capacitor $C_{I2}$ is connected to the source line SL. The first capacitor $C_{I1}$ may be a ferroelectric capacitor, and the second capacitor $C_{I2}$ may be a high-dielectric-constant capacitor.

In this embodiment of this disclosure, each voltage divider capacitor $C_I$ in the at least one voltage divider capacitor $C_I$ may be a high-dielectric-constant capacitor or a ferroelectric capacitor. Specifically, each voltage divider capacitor $C_I$ in the at least one voltage divider capacitor $C_I$ is a high-dielectric-constant capacitor. Alternatively, each voltage divider capacitor $C_I$ in the at least one voltage divider capacitor $C_I$ is a ferroelectric capacitor. Alternatively, the at least one voltage divider capacitor $C_I$ includes at least one first capacitor $C_{I1}$ and at least one second capacitor $C_{I2}$, where the first capacitor $C_{I1}$ is a high-dielectric-constant capacitor, and the second capacitor $C_{I2}$ is a ferroelectric capacitor.

In this embodiment of this disclosure, the high-dielectric-constant capacitor may use a high-dielectric-constant material as a dielectric material of the capacitor, and the ferroelectric capacitor may use a ferroelectric material as a dielectric material of the capacitor. When a medium is in an applied electric field, an induced charge is generated and the electric field is weakened. A ratio of the original applied electric field (in vacuum) to a final electric field in the medium is a dielectric constant (permittivity). The dielectric constant may represent a physical quantity of a capability of polarization and charge storage. The dielectric constant is for measuring performance of an insulator for storing electric energy. The dielectric constant is a ratio of capacitance between two metal plates when an insulating material is used as the medium to capacitance between same two metal plates when air is used as the medium or vacuum is used.

In this embodiment of this disclosure, the high-dielectric-constant (high-k) material is a type of polymer material with a high dielectric constant, and may be a material whose dielectric constant is greater than that of silicon dioxide. The dielectric constant of silicon dioxide is 3.9. To be specific, a material whose dielectric constant is greater than 3.9 is referred to as a high dielectric material.

In a possible implementation, a material whose dielectric constant is greater than that of $Si_3N_4$ is referred to as the high-dielectric-constant material, that is, a material whose dielectric constant is greater than 7 is referred to as the high dielectric material. A material whose dielectric constant k is less than that of $SiO_2$ is referred to as a low-dielectric-constant material, that is, a material whose dielectric constant is less than 3.9 is referred to as a low dielectric material. The high-dielectric-constant material may include, for example, tantalum pentaoxide, titanium oxide, and barium strontium titanate.

In this embodiment of this disclosure, electrodes of the first ferroelectric capacitor $C_F$ and the voltage divider capacitor $C_I$ include a compound. The compound may include a first metal element and a second metal element in an element periodic table, where the first metal element may be selected from a group that includes Ir and Ru. The electrode may be a compound of silicon and metal, for example, titanium, tungsten, titanium nitride (TiN), aluminum titanium nitride (TiAlN), or silicon titanium nitride (TiSiN).

In this embodiment of this disclosure, two ends of the gate electrode G of the storage cell are respectively connected to the first ferroelectric capacitor $C_F$ and one voltage divider capacitor $C_I$ for description.

Figure 5:
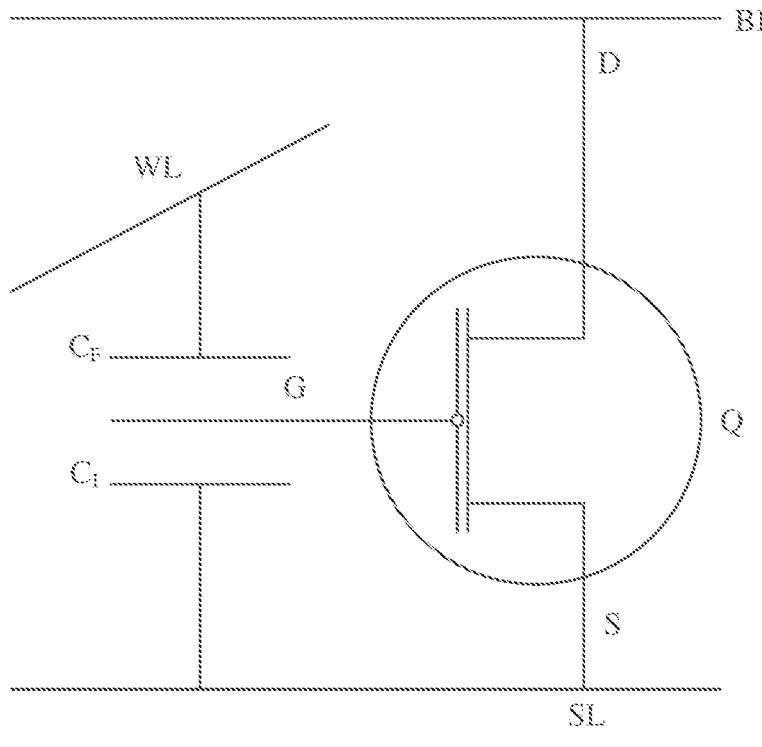
FIG. 5 is a circuit diagram of a storage cell according to an embodiment of this application.

FIG. 5 is a circuit diagram of a storage cell according to an embodiment of this disclosure. Each storage cell includes a transistor Q, a first ferroelectric capacitor $C_F$, and a voltage divider capacitor $C_I$. The transistor Q includes a source electrode S, a drain electrode D, and a gate electrode G. The source electrode S is connected to a source line SL, the drain electrode D is connected to a bit line BL, the gate electrode G is connected to a word line WL through the first ferroelectric capacitor $C_F$, and the gate electrode G is connected to the source line SL through the voltage divider capacitor $C_I$.

It may be understood that, for the transistor Q, the gate electrode G of the transistor Q may be used as one electrode, the source electrode S, the drain electrode D, and a substrate SU may be used as one electrode, and an insulation layer I or a reverse bias PN junction in the transistor Q may be used as a dielectric material. In this case, the transistor Q may be considered as a capacitor, and the storage cell includes the capacitor of the transistor Q. In this embodiment of this disclosure, the capacitor of the transistor Q is referred to as a transistor capacitor $C_{MOS}$. The transistor capacitor $C_{MOS}$ includes a first electrode and a second electrode. The gate electrode G of the transistor Q is used as the first electrode, and the source electrode S, the drain electrode D, and the substrate SU of the transistor Q are used as the second electrode.

Figure 6:
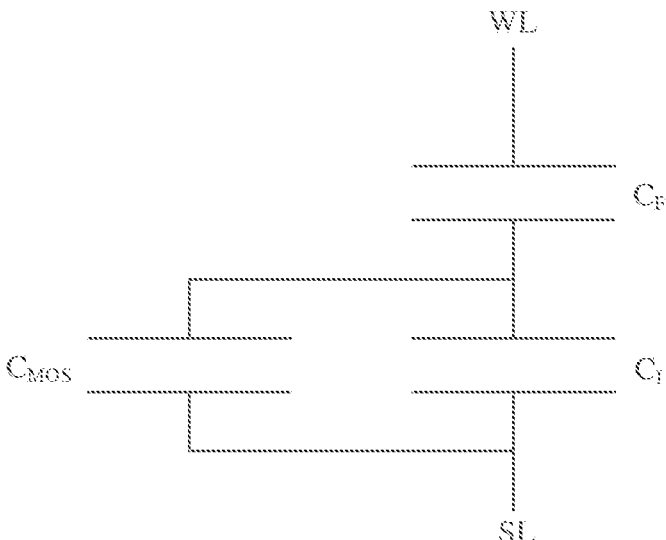
FIG. 6 is a circuit diagram of another storage cell according to an embodiment of this application.

Refer to FIG. 6. The storage cell includes the first ferroelectric capacitor $C_F$, the voltage divider capacitor $C_I$, and the transistor capacitor $C_{MOS}$, where the voltage divider capacitor $C_I$ may be a high-dielectric-constant capacitor or a ferroelectric capacitor. A first electrode of the first ferroelectric capacitor $C_F$ is connected to the word line WL, and a second electrode of the first ferroelectric capacitor $C_F$ is connected to a first electrode of the voltage divider capacitor $C_I$ and the first electrode of the transistor capacitor $C_{MOS}$, that is, the gate electrode G of the transistor Q. The second electrode of the transistor capacitor $C_{MOS}$ is connected to the source line SL. The first electrode of the voltage divider capacitor $C_I$ is connected to the second electrode of the first ferroelectric capacitor $C_F$ and the first electrode of the transistor capacitor $C_{MOS}$, and a second electrode of the voltage divider capacitor $C_I$ is connected to the source line SL. The voltage divider capacitor $C_I$ is connected between the gate electrode G and the source electrode S of the transistor Q. The voltage divider capacitor $C_I$ is connected in parallel to the transistor capacitor $C_{MOS}$. The voltage divider capacitor $C_I$ is connected in series to the first ferroelectric capacitor $C_F$.

In this embodiment of this disclosure, if the voltage divider capacitor $C_I$ and the transistor capacitor $C_{MOS}$ are connected in parallel, a total capacitance of the voltage divider capacitor $C_I$ and the transistor capacitor $C_{MOS}$ increases. In this case, under a same operating voltage, a voltage allocated to the voltage divider capacitor $C_I$ and the transistor capacitor $C_{MOS}$ decreases, and correspondingly, a voltage allocated to the first ferroelectric capacitor $C_F$ increases.

A voltage drop $V_F$ at both ends of the transistor Q capacitor is:

$$V_F = (V_{WL} - V_{SL})\frac{C_F}{C_{MOS} + C_I + C_F} \qquad (1)$$

It can be learned from the foregoing formula (1) that, after the voltage divider capacitor $C_I$ is added, the voltage allocated to the two ends of the capacitor of the transistor Q decreases, and correspondingly, the voltage allocated to the first ferroelectric capacitor $C_F$ increases. Therefore, the voltage allocated to the transistor Q is reduced, so that a smaller operating voltage can electrically polarize the first ferroelectric capacitor $C_F$ and the operating voltage is reduced. In this way, a phenomenon that the operating voltage (for example, a write voltage or a read voltage) increases to overcome a voltage drop across an interface insulation layer is avoided, and formation of a trap facilitating current leakage in the interface insulation layer or at an interface that is between the interface insulation layer and the channel is avoided, that is, an interface defect in the interface insulation layer or at the interface that is between the interface insulation layer and the channel is reduced. For example, a voltage on the insulation layer I is reduced, and defects of the insulation layer I are reduced. In this way, a charge leakage path formed due to breakdown caused by accumulation of defects (interface defects) is avoided. This improves durability and stability of the storage cell. Correspondingly, durability and stability of the ferroelectric memory are improved, and the storage window is enlarged.

In this embodiment of this disclosure, when the at least one voltage divider capacitor includes a plurality of voltage divider capacitors, the voltage allocated to the first ferroelectric capacitor $C_F$ increases, so that the operating voltage can be further reduced, the durability and stability of the storage cell can be further improved, and the durability and stability of the ferroelectric memory can be further improved.

Figure 7A:
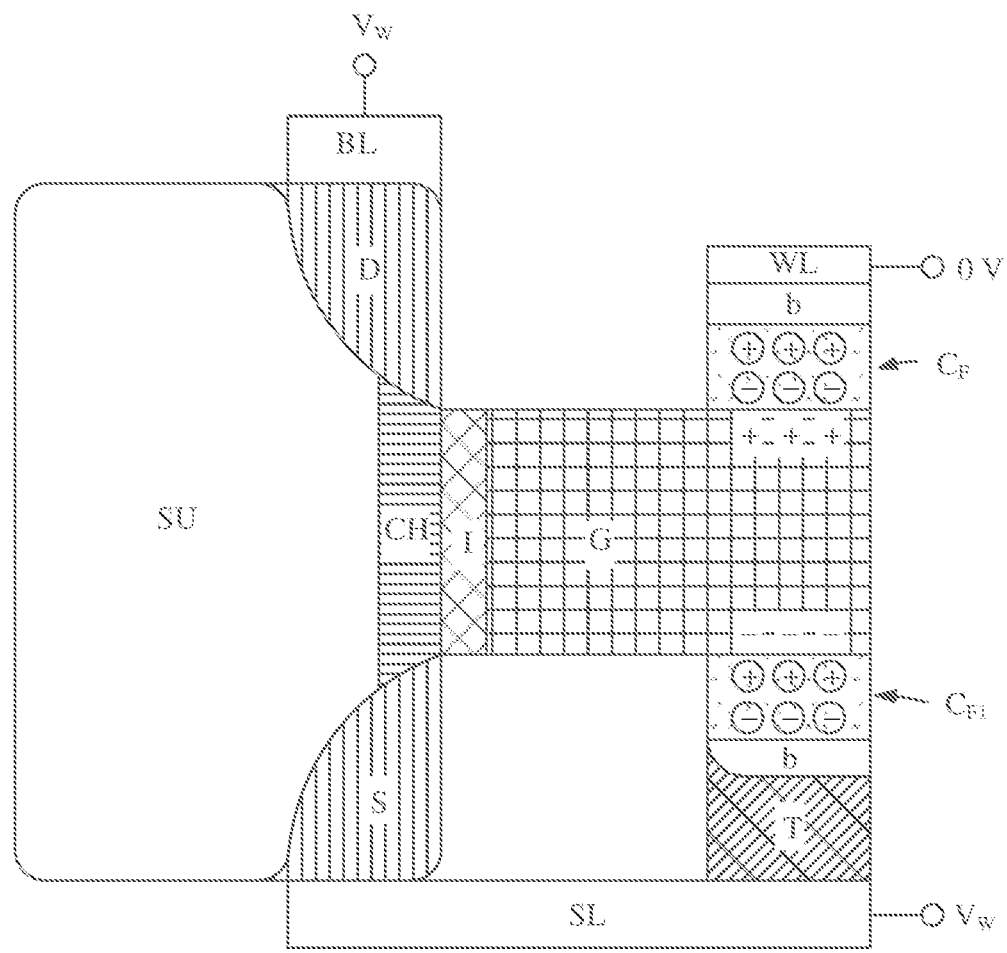
FIG. 7a is a diagram of a structure of another storage cell according to an embodiment of this application.

When the voltage divider capacitor is a ferroelectric capacitor, as shown in FIG. 7a, the storage cell includes a second ferroelectric capacitor $C_{F1}$, and the first ferroelectric capacitor $C_F$ and the second ferroelectric capacitor $C_{F1}$ are connected to the gate electrode G of the storage cell. For example, the word line WL is set to 0 potential, and the source line SL and the bit line BL are set to a first specified voltage $V_W$. The first specified voltage $V_W$ may be 2 V. An electric field is applied to the first ferroelectric capacitor $C_F$ through the word line WL, and the first ferroelectric capacitor $C_F$ generates a polarization phenomenon. If a positive charge is induced at a part that is of the first ferroelectric capacitor $C_F$ and that is close to the word line WL, a negative charge is induced at a part that is of the first ferroelectric capacitor $C_F$ and that is away from the word line WL. Based on electrostatic induction, a positive charge is induced at a part that is of the gate electrode G and that is close to the first ferroelectric capacitor $C_F$, and a negative charge is induced at a part that is of the gate electrode G and that is away from the first ferroelectric capacitor $C_F$, and correspondingly, a positive charge is induced at a part that is of the second ferroelectric capacitor $C_{F1}$ and that is close to the gate electrode G, and a negative charge is induced at a part that is of the second ferroelectric capacitor $C_{F1}$ and that is away from the gate electrode G. In this case, charge distribution of the first ferroelectric capacitor $C_F$ is different from that of the second ferroelectric capacitor $C_{F1}$.

Figure 7B:
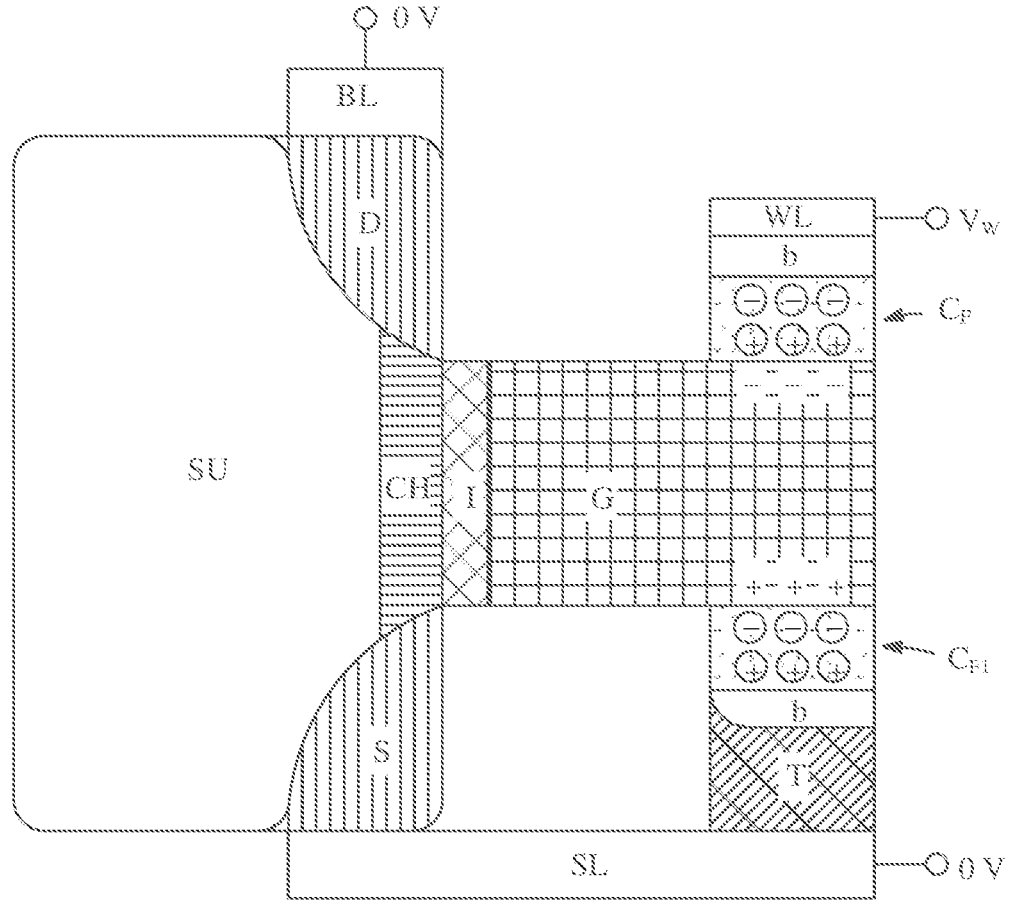
FIG. 7b is a diagram of a structure of another storage cell according to an embodiment of this application.

For example, as shown in FIG. 7b, the word line WL is set to the first specified voltage $V_W$, for example, 2 V, and the source line SL and the bit line BL are set to 0 potential. An electric field is applied to the first ferroelectric capacitor $C_F$ through the word line WL, and the first ferroelectric capacitor $C_F$ generates a polarization phenomenon. If a negative charge is induced at a part that is of the first ferroelectric capacitor $C_F$ and that is close to the word line WL, a positive charge is induced at a part that is of the first ferroelectric capacitor $C_F$ and that is away from the word line WL. Based on electrostatic induction, a negative charge is induced at a part that is of the gate electrode G and that is close to the first ferroelectric capacitor $C_F$, and a positive charge is induced at a part that is of the gate electrode G and that is away from the first ferroelectric capacitor $C_F$, and correspondingly, a negative charge is induced at a part that is of the second ferroelectric capacitor $C_{F1}$ and that is close to the gate electrode G, and a positive charge is induced at a part that is of the second ferroelectric capacitor $C_{F1}$ and that is away from the gate electrode G. In this case, charge distribution of the first ferroelectric capacitor $C_F$ is different from that of the second ferroelectric capacitor $C_{F1}$.

The first ferroelectric capacitor $C_F$ and the second ferroelectric capacitor $C_{F1}$ in the storage cell generate opposite polarization, and based on electrostatic induction, charges in the gate electrode G are balanced, and electric neutrality is maintained. This avoids charge leakage and avoids current leakage.

Figure 7C:
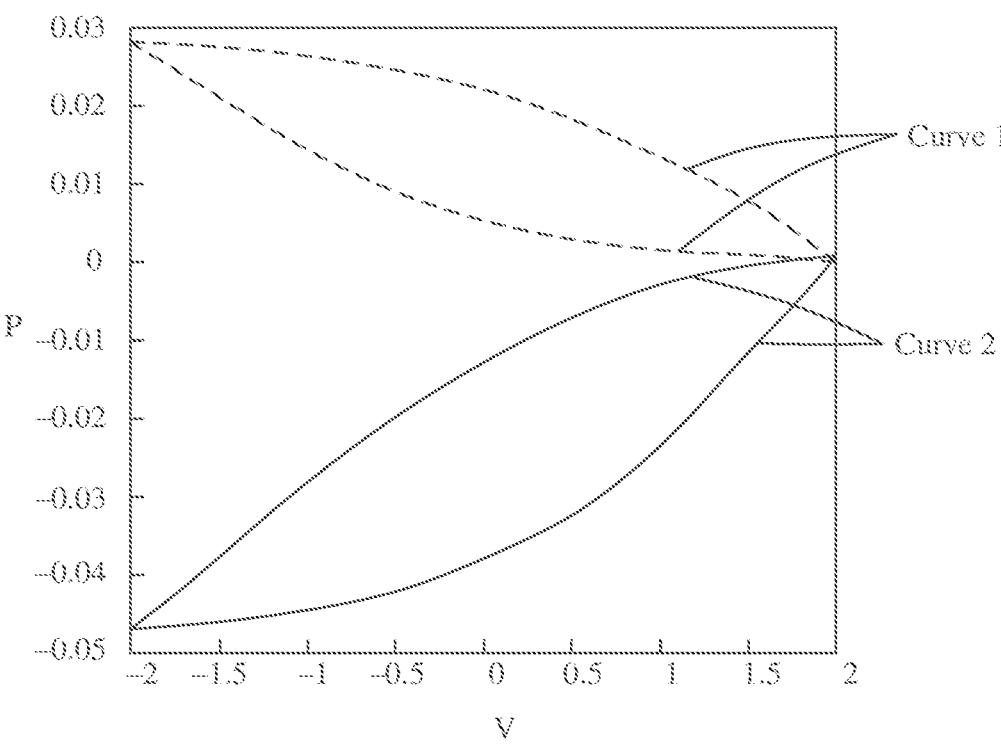
FIG. 7c is a diagram of hysteresis curves of a first ferroelectric capacitor and a second ferroelectric capacitor according to an embodiment of this application.

FIG. 7c is a diagram of hysteresis curves of a first ferroelectric capacitor and a second ferroelectric capacitor according to an embodiment of this disclosure. V represents an applied voltage on a WL corresponding to a storage cell, and P represents polarization strength of a corresponding ferroelectric capacitor. A curve 1 is a hysteresis curve of the first ferroelectric capacitor $C_F$, and a curve 2 is a hysteresis curve of the second ferroelectric capacitor $C_{F1}$. Alternatively, the curve 1 is a hysteresis curve of the second ferroelectric capacitor $C_{F1}$, and the curve 2 is a hysteresis curve of the first ferroelectric capacitor $C_F$.

In this embodiment of this disclosure, when at least one voltage divider capacitor includes one ferroelectric capacitor, the storage cell includes the first ferroelectric capacitor $C_F$, the second ferroelectric capacitor $C_{F1}$, and a transistor Q, that is, the storage cell is of a 1T2F (1 Transistor-2 Ferroelectric Capacitors) structure. Correspondingly, when the at least one voltage divider capacitor includes N–1 ferroelectric capacitors, the storage cell includes one first ferroelectric capacitor $C_{F, N-}1$ second ferroelectric capacitors $C_{F1}$, and the transistor Q, that is, the storage cell is of a 1TNF (1Transistor-N Ferroelectric Capacitors) structure. When the at least one voltage divider capacitor includes one high-dielectric-constant capacitor, the storage cell includes the first ferroelectric capacitor, the high-dielectric-constant capacitor, and the transistor Q, that is, the storage cell is of a 1T1FC (1 Transistor-1 Ferroelectric & 1 Conventional Capacitor) structure. When the at least one voltage divider capacitor includes N high-dielectric-constant capacitors, the storage cell includes the first ferroelectric capacitor, N high-dielectric-constant capacitors, and the transistor Q, that is, the storage cell is of a 1T1FNC (1 Transistor-1 Ferroelectric & NConventional Capacitor) structure.

Figure 8:
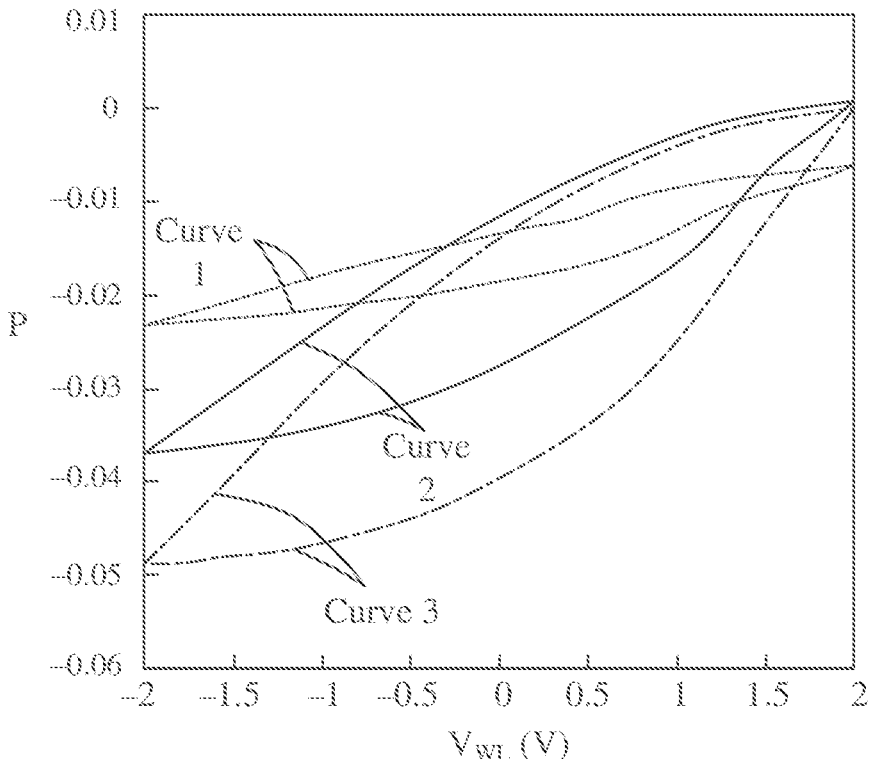
FIG. 8 is a diagram of hysteresis curve comparison according to an embodiment of this application.

FIG. 8 is a diagram of hysteresis curve comparison according to an embodiment of this disclosure. A curve 1 is a hysteresis curve of a 1T1C structure. A curve 2 is a hysteresis curve of a 1T1FC structure. A curve 3 is a hysteresis curve of a 1T2F structure. V represents an applied voltage on a word line WL corresponding to a storage cell, and P represents polarization strength of a corresponding ferroelectric capacitor.

Figure 9:
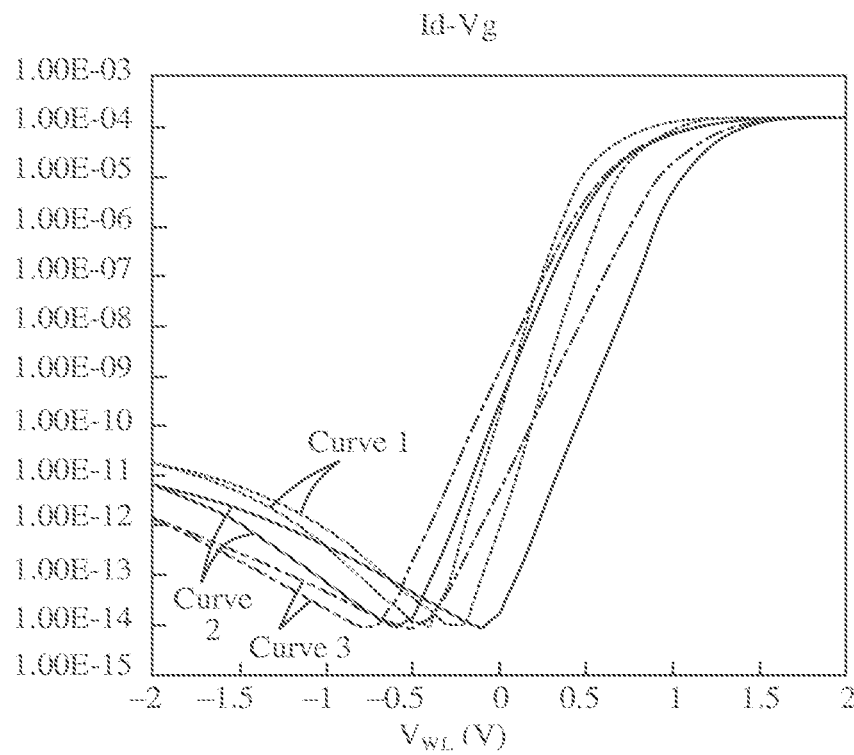
FIG. 9 is a diagram of comparison between storage windows according to an embodiment of this application.

FIG. 9 is a diagram of comparison between storage windows according to an embodiment of this disclosure. A curve 1 is a schematic curve of a current of a 1T1C structure. A curve 2 is a schematic curve of a current of a 1T1FC structure. A curve 3 is a schematic curve of a current of a 1T2F structure. V represents a voltage on a word line WL corresponding to a storage cell, that is, a voltage on a gate electrode G of a transistor Q, and Id represents a current on a bit line BL corresponding to the storage cell, that is, a drain electrode D current on the transistor Q. An example in which the voltage applied on the WL is 0 V is used for description. A current difference between two intersection points of the 1T1C structure and 0 V is less than a current difference between two intersection points of the 1T2F structure and 0 V, and a current difference between two intersection points of the 1T2F structure and 0 V is less than a current difference between two intersection points of the 1T1FC structure and 0 V. It can be learned that a storage window of the 1T1C structure is smaller than a storage window of the 1T2F structure, and a storage window of the 1T2F structure is smaller than a storage window of the 1T1FC structure.

A value of the storage window may be a ratio of a high impedance state of the ferroelectric capacitor to a low impedance state of the ferroelectric capacitor. For example, when the first ferroelectric capacitor is positively polarized, and "1" is written into, a relationship curve of a drain-source current ($I_d$) and a word line $V_{WL}$, is shifted to the right. When the first ferroelectric capacitor is negatively polarized, and "0" is written into, the relationship curve of the drain-source current ($I_d$) and the word line $V_{WL}$, is shifted to the left. The curve shifts, and a voltage on the word line $V_{WL}$ is shifted correspondingly. A size of the shift is the storage window.

Figure 10:
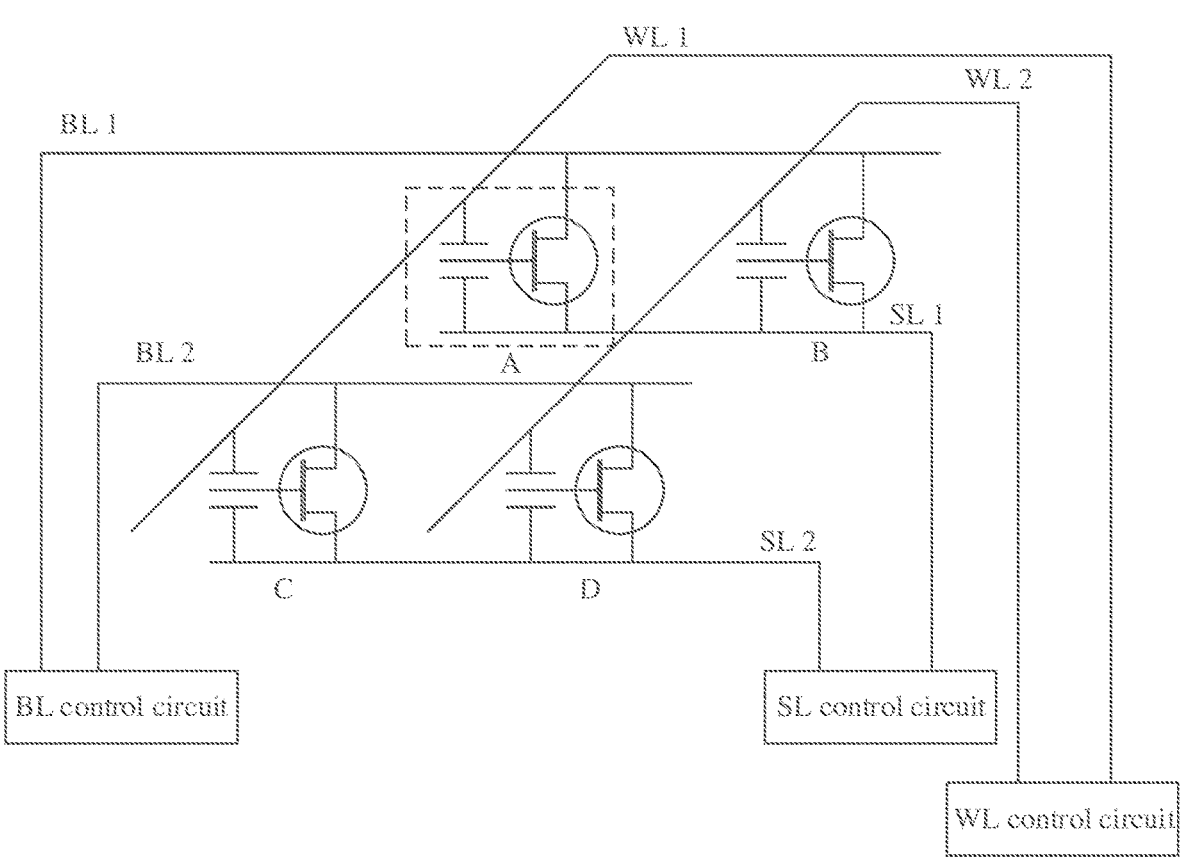
FIG. 10 is a diagram of a control circuit connection according to an embodiment of this application.

Further, when at least one storage cell includes a plurality of storage cells, different storage cells may be at a same layer, or may be at different layers. As shown in FIG. 10, BLs (for example, BL 0 and BL 1) of storage cells at different layers or a same layer may be connected to a same BL controller, sense amplifier, and the like. SLs (for example, SL 0 and SL 1) of storage cells at different layers or a same layer may be connected to a same SL controller. For example, a source line SL connection and a bit line BL connection at different layers or a same layer are implemented by a metal trace and a via. In addition, word lines WLs at different layers or a same layer may be independent of each other. For example, word lines WLs (for example, WL 0 and WL 1) at different layers or a same layer are connected to a WL control circuit having a gating function. In addition, the ferroelectric memory may be located at a metal wiring layer. In other words, the ferroelectric memory is formed by a back-end-of-line process, so that the ferroelectric memory and various controllers may be formed using a same process.

Further, different voltages are applied to m first voltage lines, m second voltage lines, and n third voltage lines, so that reading and writing on the storage cell in the ferroelectric memory can be implemented, that is, data is written into or read from the storage cell in the ferroelectric memory. The controller may control the voltages applied to the m first voltage lines, the m second voltage lines, and the n third voltage lines. The following provides descriptions by using an example in which the first voltage line is a source line SL, the second voltage line is a word line WL, and the third voltage line is a bit line BL.

Bit lines BLs (for example, BL 1 and BL 2) of storage cells at a same layer may be connected to a same BL controller, sense amplifier, and the like. Source lines SLs (for example, SL 1 and SL 2) of storage cells at a same layer may be connected to a same SL controller. For example, a source line SL connection and a bit line BL connection at a same layer are implemented by a metal trace and a via. In addition, word lines WLs at a same layer may be independent of each other. For example, word lines WLs (for example, WL 1 and WL 2) at a same layer are connected to a WL control circuit having a gating function. In addition, the ferroelectric memory may be located at a metal wiring layer. In other words, the ferroelectric memory is formed by a back-end-of-line process, so that the ferroelectric memory and various controllers may be formed by a same process.

For the foregoing ferroelectric memory, different voltages are respectively applied to the source line SL, the bit line BL, and the word line WL by using a corresponding controller, or different voltages are respectively applied to the first voltage line, the second voltage line, and the third voltage line by using a corresponding controller, or different voltages are respectively applied to the source electrode S, the drain electrode D, and the first electrode of the first ferroelectric capacitor $C_F$, so that reading and writing on the storage cell corresponding to the first ferroelectric capacitor can be implemented.

In this embodiment of this disclosure, the ferroelectric memory includes a storage cell array, the storage cell array includes a first storage cell, and the first storage cell may be understood as a storage cell selected for writing data or reading data. When data is written into one storage cell in the storage cell array, both a source line SL and a bit line BL in the storage cell array may be set to be equipotential, that is, a voltage difference between the source line SL and the bit line BL is 0 (for example, a same voltage is applied to the source line SL and the bit line BL separately). In this way, a leakage current of a write operation can be suppressed. In addition, a voltage difference between the word line WL and the bit line BL that are connected to the storage cell in the storage cell array is set to implement writing of data "0" and "1". For example, when an absolute value of a voltage difference between a WL and a bit line BL that are connected to a storage cell is equal to the first specified voltage $V_W$, the storage cell is selected, the storage cell is written as data "1" or "0", and the storage cell is the first storage cell.

Specifically, if a voltage difference between a word line WL and a bit line BL that correspond to a storage cell is equal to a positive first specified voltage $V_W$, a ferroelectric material in the storage cell is positively polarized, and the storage cell is written as a "0" state. If a voltage difference between a word line WL and a bit line BL that correspond to a storage cell is equal to a negative first specified voltage $-V_W$, a ferroelectric material in the storage cell is negatively polarized, and the storage cell is written as a "1" state. When a voltage difference between a word line WL and a bit line BL that are connected to a storage cell is set to be less than or equal to half of the first specified voltage $\frac{1}{2}V_W$, a state of the storage cell remains unchanged.

An example in which the storage cell array includes a first storage cell A, a second storage cell B, a third storage cell C, and a fourth storage cell D is used for description. In the storage cell array, source lines SLs of all storage cells in a same row are connected together, and bit lines BLs of all storage cells in a same row are connected together.

Figure 11:
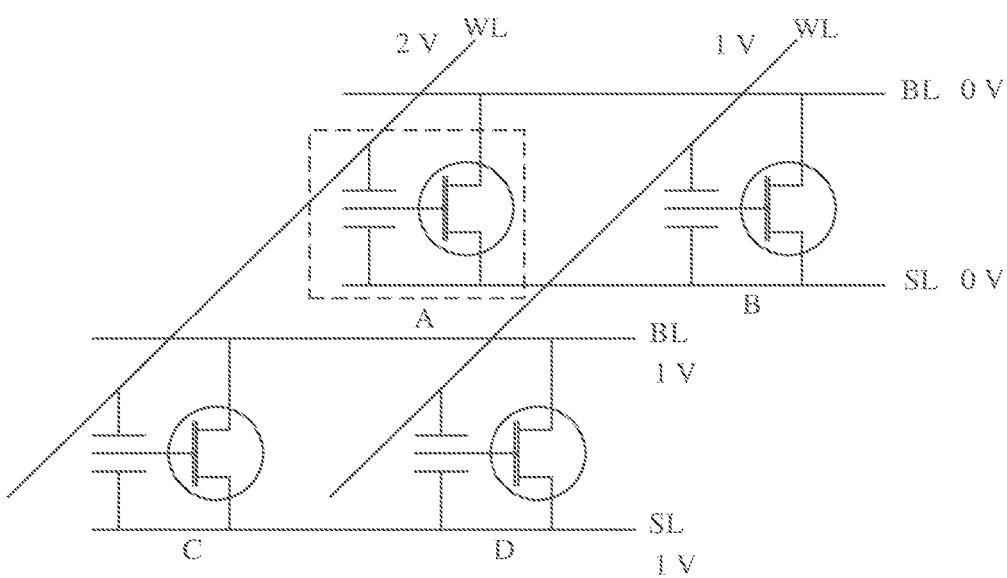
FIG. 11 is a circuit diagram during data writing according to an embodiment of this application.
Figure 12:
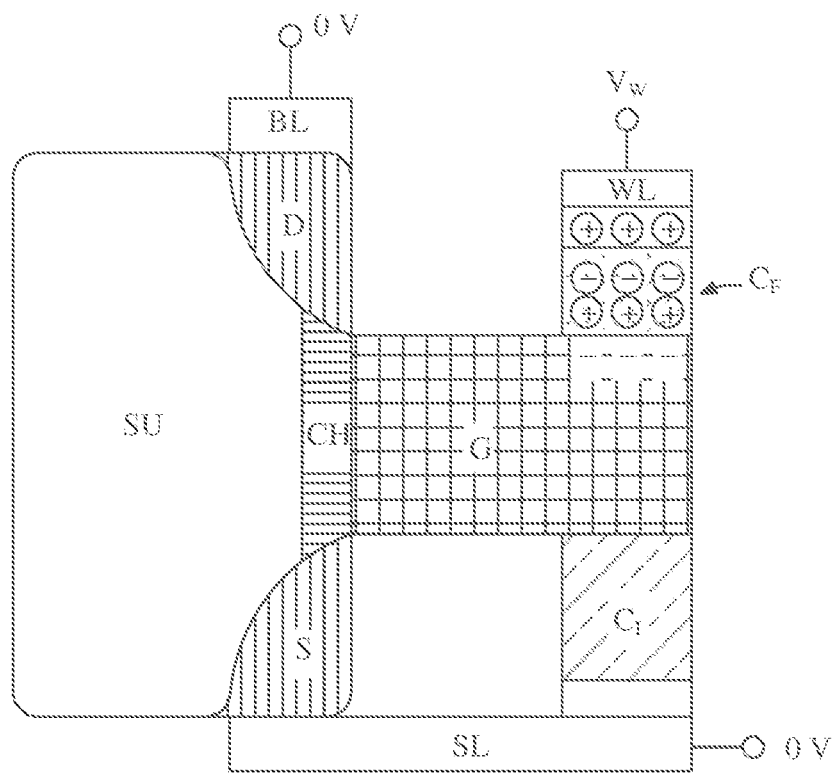
FIG. 12 is a diagram of a charge during data writing according to an embodiment of this application.

When "0" is written into one storage cell in the storage cell array, specifically, as shown in FIG. 11, both a source line SL and a bit line BL in each storage cell in the storage cell array may be set to be equipotential. For example, a source line SL and a bit line BL of each storage cell in a same row are set to be equipotential. To be specific, source lines and bit lines of the first storage cell A and the second storage cell B that are in a same row are set to 0 V, source lines and bit lines of the third storage cell C and the fourth storage cell D that are in a same row are set to 1 V. The first specified voltage $V_W$ is applied to word lines WLs of the first storage cell A and the third storage cell C, for example, the first specified voltage $V_W$ is 2 V, and a half of the first specified voltage $\frac{1}{2}V_W$ is applied to word lines WLs of the second storage cell B and the fourth storage cell D. Also refer to FIG. 12. A voltage difference between a word line WL and a bit line BL that correspond to the first storage cell A is equal to the first specified voltage $V_W$, a dielectric material in the first storage cell A is positively polarized, and the first storage cell A is written as a "0" state. A voltage difference between a WL and a BL that correspond to the second storage cell B and a voltage difference between a WL and a BL that correspond to the third storage cell C are equal to $\frac{1}{2}V_W$, that is, 1 V, and the second storage cell B and the third storage cell C are not selected to write data. A source line SL, a bit line BL, and a word line WL of the fourth storage cell D are all set to $\frac{1}{2}V_W$, and the storage cell is not selected to write data.

Figure 13:
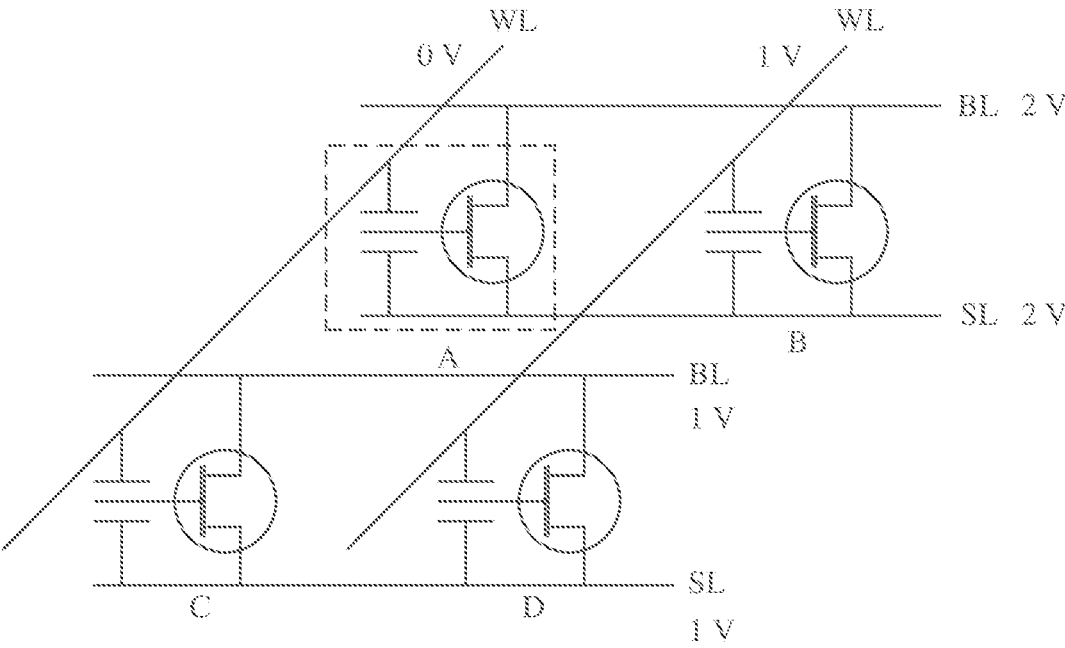
FIG. 13 is a circuit diagram during data writing according to an embodiment of this application.
Figure 14:
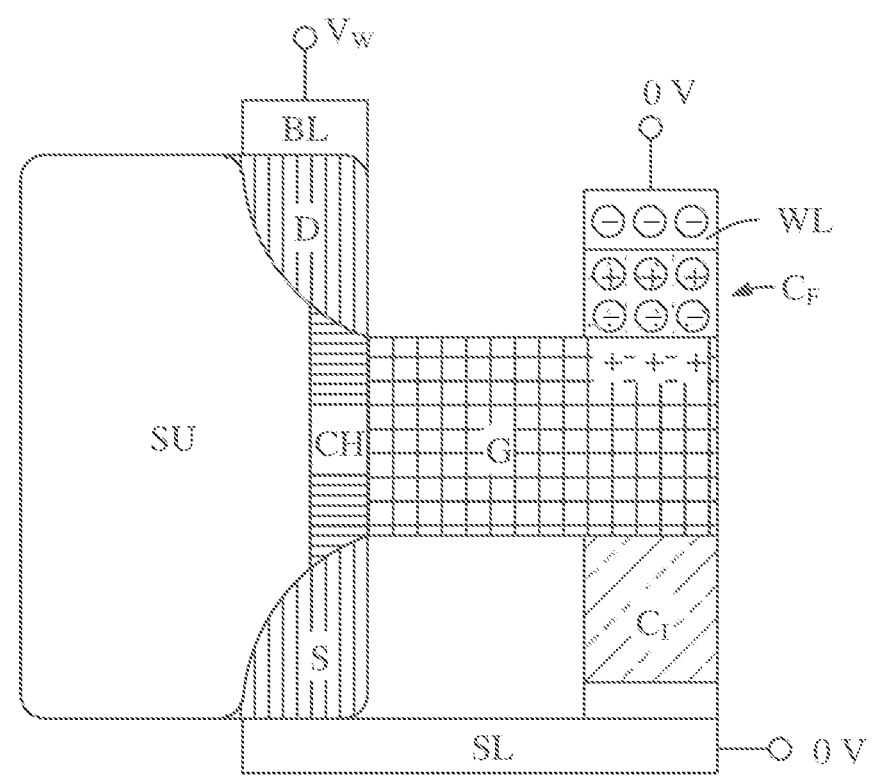
FIG. 14 is a diagram of a charge during data writing according to an embodiment of this application.

When "1" is written into one storage cell in the storage cell array, specifically, as shown in FIG. 13, both a source line SL and a bit line BL in each storage cell in the storage cell array may be set to be equipotential. For example, a source line SL and a bit line BL of each storage cell in a same row are set to be equipotential. To be specific, source lines and bit lines of the first storage cell A and the second storage cell B that are in a same row are set to 2 V, source lines and bit lines of the third storage cell C and the fourth storage cell D that are in a same row are set to 1 V. 0 V is applied to word lines WLs of the first storage cell A and the third storage cell C, and a half of the first specified voltage $\frac{1}{2}V_W$, for example, 1 V, is applied to word lines WLs of the second storage cell B and the fourth storage cell D. Also refer to FIG. 14. A voltage difference between a word line WL and a bit line BL that correspond to the first storage cell A is equal to a negative first specified voltage $-V_W$, that is, $-2$ V, a dielectric material in the first storage cell A is negatively polarized, and the first storage cell A is written as a "1" state. A voltage difference between a WL and a BL that correspond to the second storage cell B and a voltage difference between a WL and a BL that correspond to the third storage cell C are equal to a negative half of the first specified voltage $\frac{1}{2}V_W$, that is, $-1$ V, and the second storage cell B and the third storage cell C are not selected to write data. A source line SL, a bit line BL, and a word line WL of the fourth storage cell D are all set to $\frac{1}{2}V_W$, and the storage cell is not selected to write data.

In this embodiment of this disclosure, as shown in FIG. 11 and FIG. 13, each selected storage cell in the 1T1FC/1T2F storage array structure provided in this embodiment of this disclosure can be easily accessed. During data writing, a source line SL and a bit line BL are set to be equipotential, to suppress a leakage current of a write operation. When the voltage difference between the word line WL and the bit line BL of the storage cell is $V_W$ (for example, 2 V), a ferroelectric thin film of the storage cell is positively polarized, and the storage cell is written as a "0" state; or when the voltage difference between the word line WL and the bit line BL of the storage cell is $-V_W$ (for example, $-2$ V), the ferroelectric thin film of the storage cell is negatively polarized, and the storage cell is written as a "1" state.

In addition, in a data writing process, for another storage cell other than the first storage cell, an absolute value of a voltage difference between a word line WL and a bit line BL that correspond to the another storage cell may be set to be less than $\frac{1}{2}V_W$, to ensure that a state of the another storage cell remains unchanged. In the storage cell array, another storage cell other than the first storage cell is a second storage cell, that is, an unselected storage cell is the second storage cell. For the second storage cell, a source line SL, a bit line BL, and a word line WL that are in the second storage cell may all be set to $\frac{1}{2}V_W$, or the source line SL, the bit line BL, and the word line WL that are in the second storage cell are enabled to be in a floating state, so that false writing in an unselected storage cell can be avoided.

In this embodiment of this disclosure, the first specified voltage $V_W$ is greater than or equal to a critical voltage, where the critical voltage herein may be a critical voltage that reverses a polarization direction of the ferroelectric capacitor.

It should be noted that, in embodiments of this disclosure, an example in which data "0" corresponds to a low-impedance state and data "1" corresponds to a high-impedance state is used for description. In actual application, alternatively, the data "0" may correspond to the high-impedance state and the data "1" may correspond to the low-impedance state. This is not limited in embodiments of this disclosure.

When data is read from the first storage cell in the storage cell array, the gate electrode G of the first storage cell needs to be pre-charged before the data is read, that is, the gate electrode G is charged to a potential, and the gate electrode G is held in a floating state. Then, a data reading operation is performed, that is, a source line SL of the storage cell is set to 0 potential, a bit line BL of the storage cell is set to a second specified voltage $V_{BLR}$, and a word line WL of the storage cell is set to a third specified voltage $V_{WLR}$.

Figure 15:
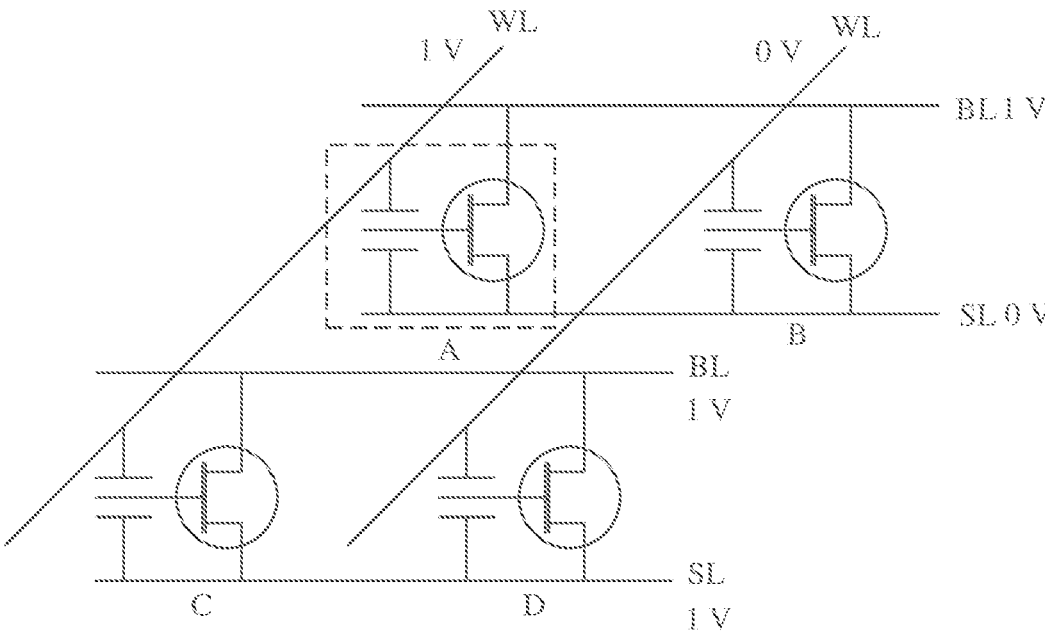
FIG. 15 is a circuit diagram during data reading according to an embodiment of this application.

Specifically, also refer to FIG. 15. A source line SL of a first storage cell A is set to 0 potential, a bit line BL of the first storage cell A is set to the second specified voltage $V_{BLR}$, for example, 1 V, and a word line WL of the first storage cell A is set to the third specified voltage $V_{WLR}$, for example, 1 V. In this case, the first storage cell A is the first storage cell. The source line SL of the second storage cell is set to 0 potential, the bit line BL of the second storage cell B is set to the second specified voltage $V_{BLR}$, for example, 1 V, and the word line WL of the second storage cell A is set to 0 potential. The source line SL and the bit line BL of the third storage cell C are set to be equipotential, for example, 1 V, and the word line WL of the third storage cell C is set to 1 V. The source line SL and the bit line BL of the fourth storage cell D are set to be equipotential, for example, 1 V, and the word line WL of the fourth storage cell D is set to 0 V. In this case, the second storage cell B, the third storage cell C, and the fourth storage cell D are not selected.

Figure 16:
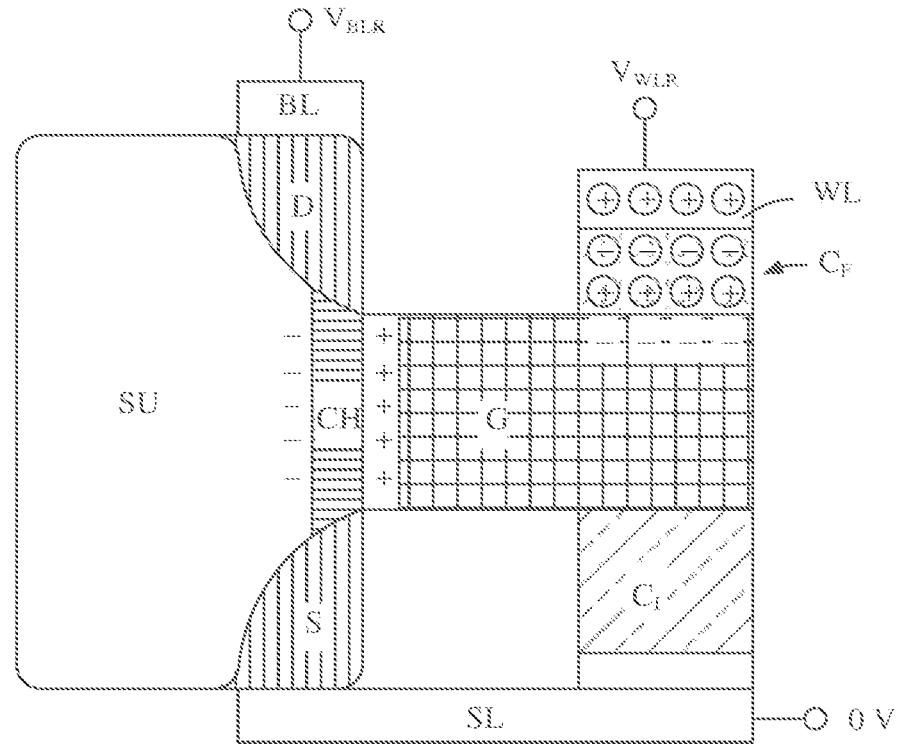
FIG. 16 is a diagram of a charge during data reading according to an embodiment of this application.

As shown in FIG. 16, if data in a first storage cell is "0", positive polarization of a ferroelectric material in the first storage cell is strengthened. In this case, a part of negative charges is attracted at a part that is of a gate electrode G and that is close to the ferroelectric material, and a positive charge is induced at a part that is of the gate electrode G and that is close to a channel CH, so that a negative charge is induced on a surface of the channel CH, and a high current is read, that is, the data "0" is read.

Figure 17:
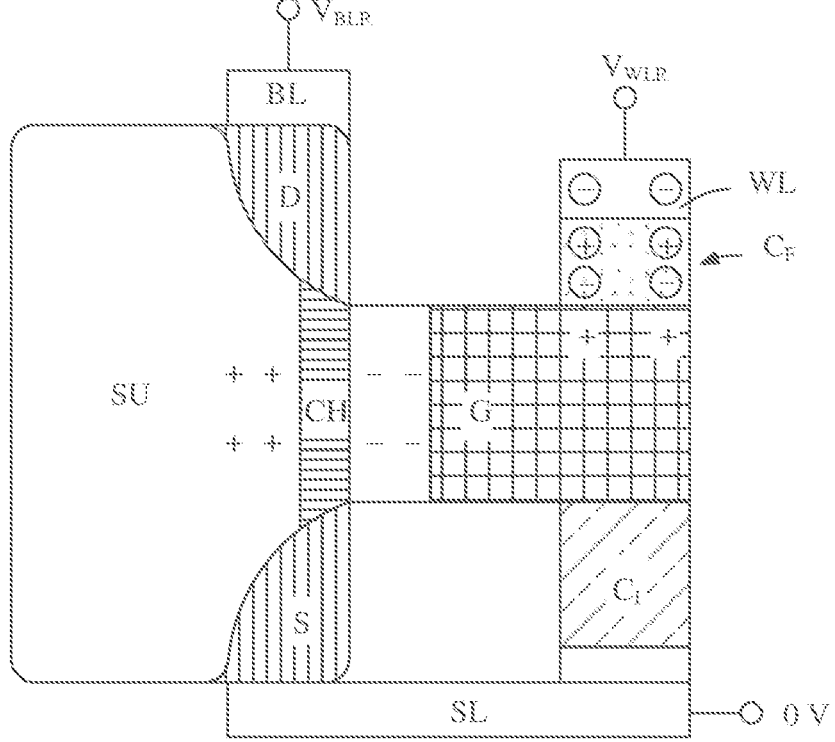
FIG. 17 is a diagram of a charge during data reading according to an embodiment of this application.

As shown in FIG. 17, if data in a first storage cell is "1", negative polarization of a ferroelectric material in the first storage cell is weakened. In this case, a part of positive charges that are bound by ferroelectricity in a negative polarization state and that are in a gate electrode G in the first storage cell is released, and a negative charge is induced at a part that is of the gate electrode G and that is close to a channel CH, so that a positive charge is induced on a surface of the channel CH, and a low current is read, that is, the data"1" is read.

Figure 18:
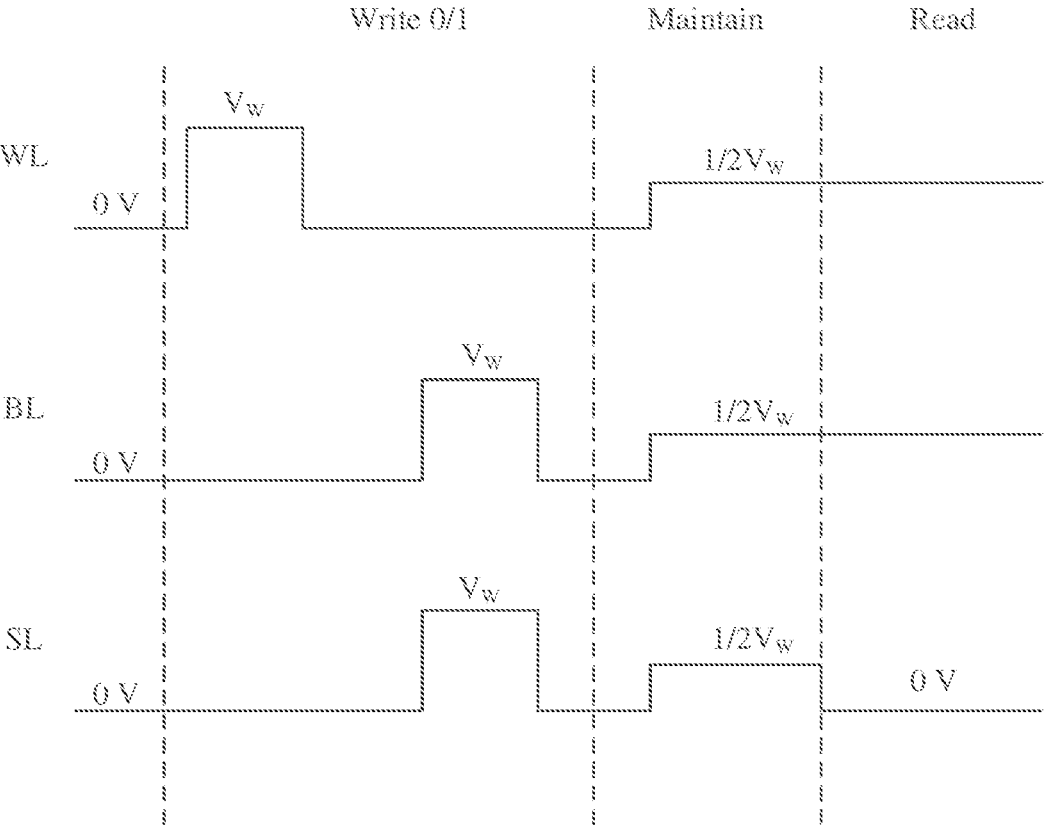
FIG. 18 is a diagram of an applied voltage during data reading and writing according to an embodiment of this application.

For example, also refer to FIG. 18. For a first storage cell, when "0" is written into, a word line WL of the first storage cell is set to a first specified voltage $V_W$, a source line SL of the first storage cell is set to 0 potential, and a bit line BL of the first storage cell is set to 0 potential. When "1" is written into, the word line WL of the first storage cell is set to 0 potential, the source line SL of the first storage cell is set to the first specified voltage $V_W$, and the bit line WL of the first storage cell is set to the first specified voltage $V_W$. When the first storage cell maintains a state, the source line SL, the bit line BL, and the word line WL of the first storage cell are all set to ½$V_W$. When data of the first storage cell is read, the word line WL of the first storage cell is set to the first specified voltage $V_W$, the source line SL of the first storage cell is set to the first specified voltage $V_W$, and the bit line WL of the first storage cell is set to 0 potential.

In addition, in a process of data reading, for another storage cell that is in a plurality of storage cells and that is other than the first storage cell, a word line WL corresponding to the another storage cell may be grounded or set to a floating state. In this way, it can be ensured that a state of the another storage cell remains unchanged. For another storage cell that is in at least one storage cell and that does not need to perform data reading, both a source line SL and a bit line BL in the another storage cell may be set to 0 potential. In this way, it can be ensured that no leakage current is generated for an unselected storage cell.

In view of this, an embodiment of this disclosure further provides a storage device. The storage device includes a circuit board and a ferroelectric memory connected to the circuit board. The ferroelectric memory may be any ferroelectric memory provided above. The circuit board may be a printed circuit board (PCB). Certainly, the circuit board may alternatively be a flexible circuit board (FPC), and the like. The circuit board is not limited in this embodiment. Optionally, the storage device is user equipment or a terminal device of different types such as a computer, a mobile phone, a tablet computer, a wearable device, and a vehicle-mounted device. Alternatively, the storage device may be a network device, for example, a base station.

Optionally, the storage device further includes a package substrate. The package substrate is fastened on the printed circuit board (PCB) by using a solder ball, and the ferroelectric memory is fastened on the package substrate by using the solder ball.

Based on this, an embodiment of this disclosure further provides a storage device. The storage device includes a controller and a ferroelectric memory. The controller is configured to control reading and writing in the ferroelectric memory. The ferroelectric memory may be any ferroelectric memory provided above.

In another aspect of this disclosure, a non-transitory computer-readable storage medium used with a computer is further provided. The computer has software for designing an integrated circuit. The computer-readable storage medium stores one or more computer-readable data structures. The one or more computer-readable data structures include optical mask data for manufacturing any one of the ferroelectric memories provided above.

In conclusion, the foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

In conclusion, the foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

What is claimed is:

1. A ferroelectric memory, comprising:
at least one storage cell, wherein each storage cell comprises:
a transistor, comprising a gate electrode, a source electrode, and a drain electrode;
a first ferroelectric capacitor, comprising a first electrode and a second electrode, wherein the first electrode of the first ferroelectric capacitor is coupled to the gate electrode, and the second electrode of the first ferroelectric capacitor is coupled to a word line; and
at least one voltage divider capacitor, comprising:
a first electrode and a second electrode, wherein the first electrode of each voltage divider capacitor is separately coupled to the gate electrode, and the second electrode of each voltage divider capacitor is separately coupled to the source electrode; and at least one first capacitor, wherein the first capacitor is a high-dielectric-constant capacitor; and at least one second capacitor, wherein the second capacitor is a ferroelectric capacitor.

2. The ferroelectric memory of claim 1, wherein the voltage divider capacitor is a high-dielectric-constant capacitor.

3. The ferroelectric memory of claim 1, wherein the voltage divider capacitor is a ferroelectric capacitor, and a dielectric material of the ferroelectric capacitor comprises a ferroelectric material.

4. The ferroelectric memory of claim 1, wherein the ferroelectric memory further comprises:
  a bit line, coupled to the drain electrode;
  a source line, coupled to the source electrode; and
  the word line, coupled to the second electrode of the first ferroelectric capacitor.

5. The ferroelectric memory of claim 1, wherein the ferroelectric memory further comprises:
  a first voltage line, wherein a first end of the first voltage line is coupled to the source electrode, and a second end of the first voltage line is coupled to a controller;
  a second voltage line, wherein a first end of the second voltage line is coupled to the drain electrode, and a second end of the second voltage line is coupled to the controller; and
  a third voltage line, wherein a first end of the third voltage line is coupled to the second electrode of the first ferroelectric capacitor, and a second end of the third voltage line are coupled to the controller.

6. The ferroelectric memory of claim 5, wherein the at least one storage cell comprises:
  a first storage cell, wherein when data is written into the first storage cell, a voltage difference between the first voltage line and the second voltage line of the first storage cell is 0, and an absolute value of a voltage difference between the third voltage line and the second voltage line of the first storage cell is equal to a first specified voltage.

7. The ferroelectric memory of claim 6, wherein the at least one storage cell further comprises:
  a second storage cell, wherein when the data is written into the first storage cell, an absolute value of a voltage difference between the third voltage line and the second voltage line of the second storage cell is less than one half of the first specified voltage.

8. The ferroelectric memory of claim 6, wherein when the data is written into the first storage cell, the first voltage line, the second voltage line, and the third voltage line of a second storage cell in the at least one storage cell are all in a floating state.

9. The ferroelectric memory of claim 6, wherein when the data is written into the first storage cell, bias voltages of the first voltage line, the second voltage line, and the third voltage line of a second storage cell in the at least one storage cell are all one half of the first specified voltage.

10. The ferroelectric memory of claim 6, wherein when the data is read from the first storage cell in the at least one storage cell, a bias voltage of the first voltage line of the first storage cell is 0, a bias voltage of the second voltage line of the first storage cell is a second specified voltage, and a bias voltage of the third voltage line of the first storage cell is a third specified voltage.

11. The ferroelectric memory of claim 5, wherein when the data is read from the first storage cell in the at least one storage cell, the third voltage line of a second storage cell in the at least one storage cell is in the floating state or grounded.

12. The ferroelectric memory of claim 5, wherein when the data is read from the first storage cell in the at least one storage cell, the bias voltages of the first voltage line and the second voltage line of a second storage cell in the at least one storage cell are both 0.

13. A storage device, wherein the storage device comprises:
  a controller, configured to control reading and writing of a ferroelectric memory; and
  the ferroelectric memory, comprising:
  at least one storage cell, wherein each storage cell comprises:
  a transistor, comprising a gate electrode, a source electrode, and a drain electrode;
  a first ferroelectric capacitor, comprising a first electrode and a second electrode, wherein the first electrode of the first ferroelectric capacitor is coupled to the gate electrode, and the second electrode of the first ferroelectric capacitor is coupled to a word line; and
  at least one voltage divider capacitor, comprising a first electrode and a second electrode, wherein
    the first electrode of each voltage divider capacitor is separately coupled to the gate electrode, and the second electrode of each voltage divider capacitor is separately coupled to the source electrode; and
    at least one first capacitor, wherein the first capacitor is a high-dielectric-constant capacitor; and at least one second capacitor, wherein the second capacitor is a ferroelectric capacitor.

14. The storage device of claim 13, wherein the voltage divider capacitor is a high-dielectric-constant capacitor.

15. The storage device of claim 13, wherein the voltage divider capacitor is a ferroelectric capacitor, and a dielectric material of the ferroelectric capacitor comprises a ferroelectric material.

16. The storage device of claim 13, wherein the ferroelectric memory further comprises:
  a bit line, coupled to the drain electrode;
  a source line, coupled to the source electrode; and
  the word line, coupled to the second electrode of the first ferroelectric capacitor.

17. The storage device of claim 13, wherein the ferroelectric memory further comprises:
  a first voltage line, wherein a first end of the first voltage line is coupled to the source electrode, and a second end of the first voltage line is coupled to a controller;
  a second voltage line, wherein a first end of the second voltage line is coupled to the drain electrode, and a second end of the second voltage line is coupled to the controller; and
  a third voltage line, wherein a first end of the third voltage line is coupled to the second electrode of the first ferroelectric capacitor, and a second end of the third voltage line are coupled to the controller.

18. The storage device of claim 17, wherein the at least one storage cell comprises:
  a first storage cell, wherein when data is written into the first storage cell, a voltage difference between the first voltage line and the second voltage line of the first storage cell is 0, and an absolute value of a voltage difference between the third voltage line and the second voltage line of the first storage cell is equal to a first specified voltage.

*     *     *     *     *